United States Patent
Hiraoka et al.

(10) Patent No.: US 10,154,589 B2
(45) Date of Patent: Dec. 11, 2018

(54) ELECTRONIC CONTROL DEVICE

(71) Applicant: Hitachi Automotive Systems, Ltd., Hitachinaka-shi, Ibaraki (JP)

(72) Inventors: Miki Hiraoka, Tokyo (JP); Shiro Yamashita, Tokyo (JP); Tomishige Yatsugi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 326 days.

(21) Appl. No.: 14/784,124

(22) PCT Filed: Apr. 23, 2014

(86) PCT No.: PCT/JP2014/061349
§ 371 (c)(1),
(2) Date: Oct. 13, 2015

(87) PCT Pub. No.: WO2014/175297
PCT Pub. Date: Oct. 30, 2014

(65) Prior Publication Data
US 2016/0073504 A1 Mar. 10, 2016

(30) Foreign Application Priority Data

Apr. 26, 2013 (JP) .................. 2013-093210
Mar. 17, 2014 (JP) .................. 2014-053436

(51) Int. Cl.
*H05K 1/11* (2006.01)
*H05K 1/18* (2006.01)
*H05K 3/34* (2006.01)

(52) U.S. Cl.
CPC ............ *H05K 1/181* (2013.01); *H05K 1/111* (2013.01); *H05K 3/3442* (2013.01);
(Continued)

(58) Field of Classification Search
CPC ........ H05K 1/111; H05K 1/162; H05K 1/167; H05K 1/182; H05K 1/0231; H05K 1/0306;
(Continued)

(56) References Cited

U.S. PATENT DOCUMENTS 5,400,953 A    3/1995  Maeno
5,707,714 A *  1/1998  Furutatsu ............. H05K 3/3452
                                                              174/250

(Continued)

FOREIGN PATENT DOCUMENTS

JP    57-181062 U    11/1982
JP    7-14673 U     3/1995
(Continued)

OTHER PUBLICATIONS

Extended European Search Report issued in counterpart European Application No. 14789081.8 dated Mar. 21, 2017 (nine (9) pages).
(Continued)

*Primary Examiner* — Tuan T Dinh
(74) *Attorney, Agent, or Firm* — Crowell & Moring LLP

(57) ABSTRACT

The objective of the present invention is to improve reliability in a solder connection portion between an electronic component and a wiring pattern. A pair of wiring patterns (31A and 31B) are formed on a circuit wiring board (30) with an insulation layer (37) therebetween. Each wiring pattern (31A and 31B) has a land (33*a* or 33*b*) and a wiring portion (34*a* or 34*b*) that is narrower than the land. By way of solder (42), a chip component (41) is soldered to the lands (33*a* and 33*b*). The x (width) direction center (Xa) of each connection portion (53) where a respective wiring portion (34*a* or 34*b*) is connected to a respective land (33*a* or 33*b*) is disposed at a position that is outside of both the region in which a region of predetermined width (Wc) of the chip component (41) extends in the x (longitudinal) direction, and the region in which a region of predetermined length
(Continued)

(Lc) of the chip component (41) extends in a y (transverse) direction.

8 Claims, 19 Drawing Sheets

(52) U.S. Cl.
CPC .............. *H05K 2201/09381* (2013.01); *H05K 2201/09427* (2013.01); *H05K 2201/09663* (2013.01); *H05K 2201/10621* (2013.01); *H05K 2201/10636* (2013.01); *Y02P 70/611* (2015.11); *Y02P 70/613* (2015.11)

(58) Field of Classification Search
CPC ......... H05K 2201/10734; H05K 3/308; H05K 3/3426
USPC ............................ 361/763–774; 174/259–264
See application file for complete search history.

(56) References Cited

U.S. PATENT DOCUMENTS

| | | | |
|---|---|---|---|
| 6,169,253 B1 * | 1/2001 | Jairazbhoy | H05K 3/3442 174/250 |
| 6,570,259 B2 * | 5/2003 | Alcoe | H01L 21/563 174/539 |
| 7,646,610 B2 * | 1/2010 | Watanabe | H01F 27/292 336/234 |
| 7,872,874 B2 * | 1/2011 | Karasawa | H05K 1/111 361/767 |
| 2008/0066955 A1 | 3/2008 | Nodo et al. | |

FOREIGN PATENT DOCUMENTS

| | | |
|---|---|---|
| JP | 2005-228921 A | 8/2005 |
| JP | 2008-72065 A | 3/2008 |
| JP | 2011-243878 A | 12/2011 |
| WO | WO 2010/008033 A1 | 1/2010 |

OTHER PUBLICATIONS

International Search Report (PCT/ISA/210) issued in PCT Application No. PCT/JP2014/061349 dated Jul. 29, 2014 with English-language translation (four (4) pages).

* cited by examiner

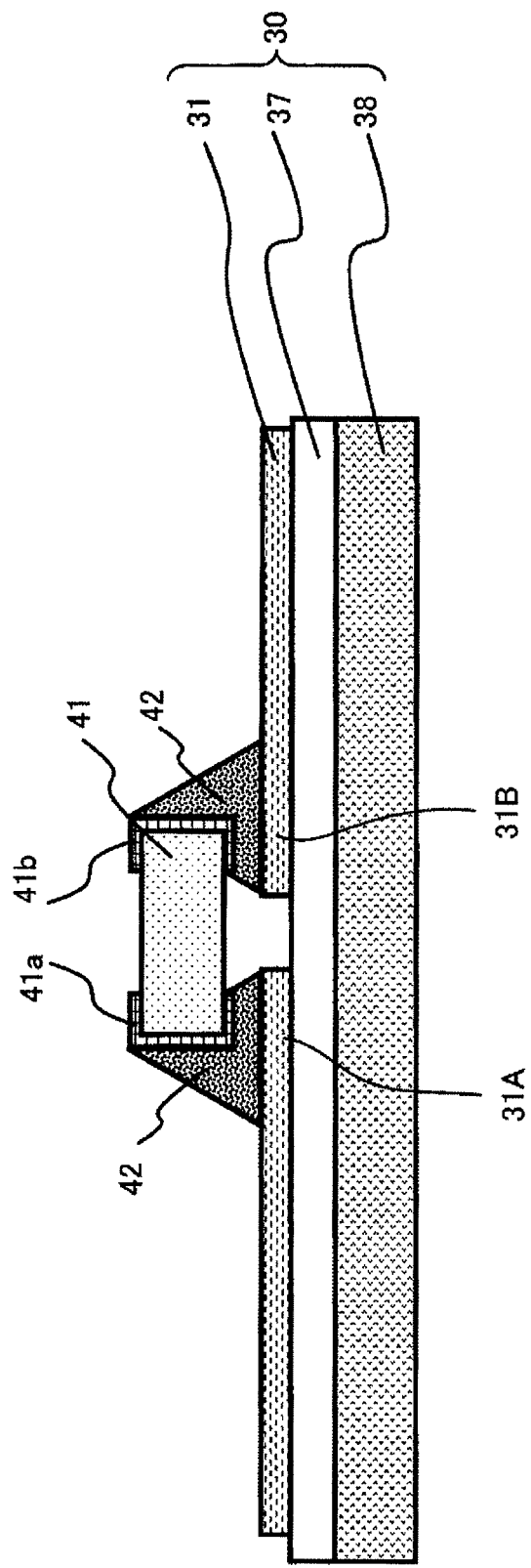

FIG. 19

| SAMPLE \ NUMBER OF CYCLES | 500 | 1,000 | 1,500 | 2,000 | 2,500 | 3,000 |
|---|---|---|---|---|---|---|
| EMBODIMENT 2 (FIG. 4) | 0 PC/5 PCS | 0 PC/5 PCS | 0 PC/5 PCS | 0 PC/5 PCS | 0 PC/5 PCS | 0 PC/5 PCS |
| EMBODIMENT 8 (FIG. 10) | 0 PC/5 PCS | 0 PC/5 PCS | 0 PC/5 PCS | 0 PC/5 PCS | 0 PC/5 PCS | 0 PC/5 PCS |
| COMPARATIVE EXAMPLE 1 (FIG. 17) | 0 PC/5 PCS | 0 PC/5 PCS | 3 PCS/5 PCS | 5 PCS/5 PCS | 5 PCS/5 PCS | 5 PCS/5 PCS |
| COMPARATIVE EXAMPLE 2 (FIG. 18) | 0 PC/5 PCS | 0 PC/5 PCS | 2 PCS/5 PCS | 5 PCS/5 PCS | 5 PCS/5 PCS | 5 PCS/5 PCS |

ELECTRONIC CONTROL DEVICE

TECHNICAL FIELD

The present invention relates to an electronic control device including a circuit wiring board in which an electronic component is connected to a land.

BACKGROUND ART

On a vehicle such as an automobile, various electronic control devices for engine control, for motor control, for automatic transmission control, and the like for example are mounted. As the electronic control device, there is one including a MOSFET for switching an inverter device, a DC-DC converter device, and the like, a capacitor module, and the like. Such electronic control device includes a circuit wiring board having plural solid wiring patterns and a chip component in which the electrodes formed in both ends are soldered to the wiring patterns.

Because an electronic control device for a vehicle is installed under an environment with sharp temperature change, solid wiring patterns and a chip component repeat expansion and shrinkage, and a crack is liable to occur in solder that connects the chip component and the wiring patterns to each other.

As a countermeasure for it, a surface mounting structure is known in which lands soldered to the electrodes of the chip component and wiring that connects the lands and the wiring patterns to each other are arranged in a circuit wiring board. With the surface mounting structure, it is assumed that the stress applied to the solder can be absorbed by making the width of the wiring narrower than the width of the chip component soldered to the land. The connection part of each land and the wiring is disposed within a region in which the region of the width of the chip component extends in the longitudinal direction or within a region in which the region of the length of the chip component extends in the transverse direction (refer to FIG. 1(a) of Patent Literature 1 for example).

CITATION LIST

Patent Literature

Patent Literature 1: JP-A-2008-72065

SUMMARY OF INVENTION

Technical Problem

In the electronic control device described in Patent Literature 1, the connection portion of each land and the wiring is disposed within a region in which the region of the width of the chip component extends in the longitudinal direction or within a region in which the region of the length of the chip component extends in the transverse direction. In this structure, the distances from the wiring to the solder connection portions connected to both side surfaces of the chip component are generally equal to each other. Therefore, a large stress is generated in both sides in the width direction of the solder connection portion formed on the land, and the crack is liable to occur in both sides in the width direction of this solder connection portion formed on the land. Although the crack generated in the solder connection portion progresses from both sides in the width direction of the solder connection portion toward the center, because the distance to the position where the crack reaches the center in the width direction of the connection portion and wire breakage occurs is short, the lifetime becomes short which lacks the reliability.

Solution to Problem

An electronic control device of the present invention includes a circuit wiring board in which a wiring pattern is formed on a base metal, with the wiring pattern including a pair of patterns having a large area, a pair of lands arranged between the pair of patterns at a predetermined interval and having an area smaller than that of the pattern, and a pair of wiring portions connecting the pair of lands and the pair of patterns respectively, and an electronic component in which electrodes having a predetermined length and a predetermined width and arranged in one end and the other end in the longitudinal direction respectively are connected to the respective lands respectively, in which the wiring portions are arranged so that the center in the width direction of the connection portion connected to the land is disposed at a position that is outside of both a region in which a region of the predetermined width of the electronic component extends in the longitudinal direction of the electronic component and a region in which a region of the predetermined length of the electronic component extends in the transverse direction of the electronic component.

Advantageous Effects of Invention

According to the present invention, because the length to the point where the wire breakage caused by the crack of the solder occurs becomes long, the lifetime until the wire breakage can be made long, and the reliability can be improved.

BRIEF DESCRIPTION OF DRAWINGS

FIG. 2 is an enlarged cross-sectional view of a circuit wiring board illustrated in FIG. 1 on which the chip component is mounted.

FIG. 3B is an enlarged view of the region IIIb of FIG. 3A.

FIG. 4A is a plan view of wiring patterns 31A, 31B on which the chip component 41 is mounted as viewed from the top, and FIG. 4B is an enlarged view of the region IVb of FIG. 4A.

FIG. 19 is a drawing showing a test result of the wire breakage by the crack generated in the solder connection portion.

DESCRIPTION OF EMBODIMENTS

Embodiment 1

[Overall Structure of Electronic Control Device]

Figure 1:
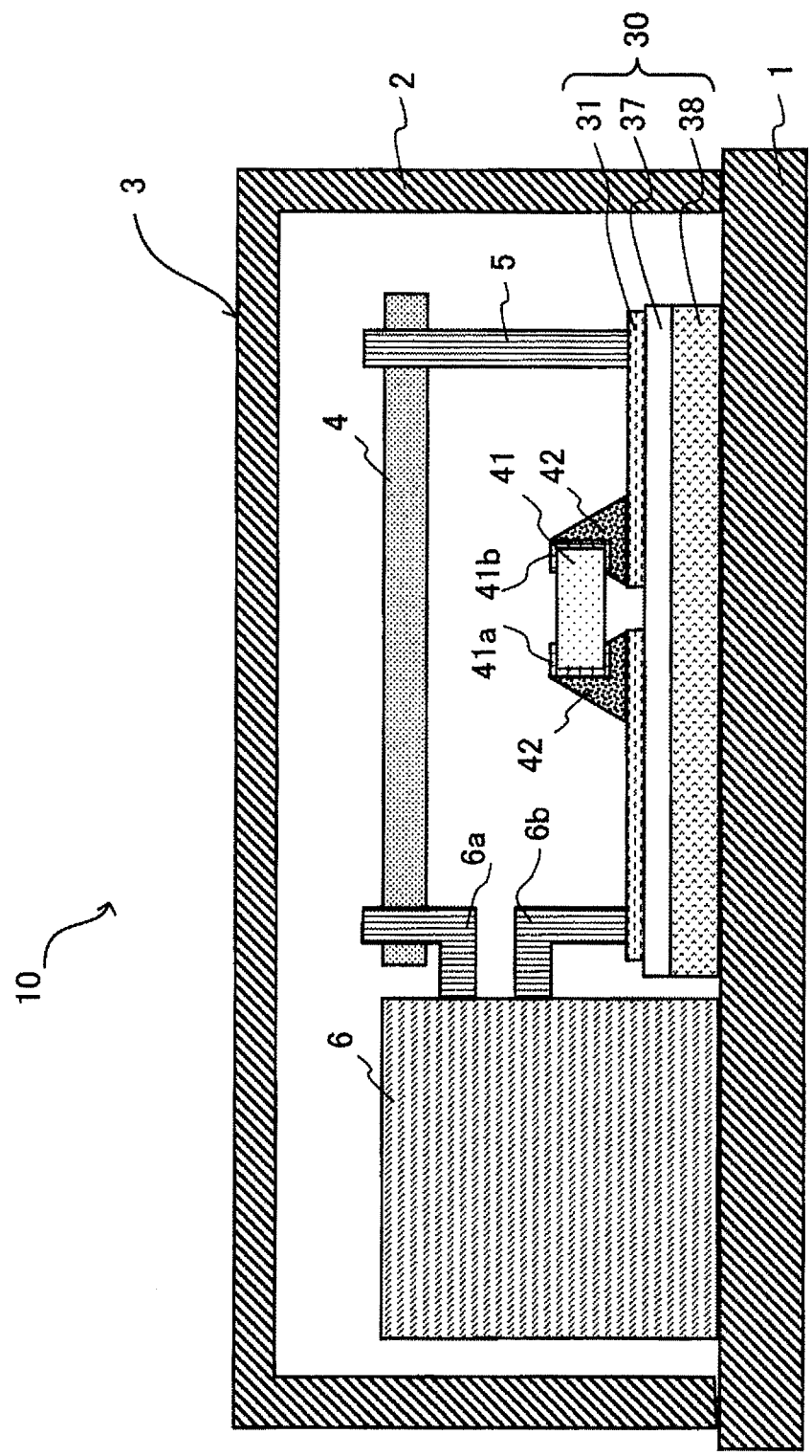
FIG. 1 is a cross-sectional view of an electronic control device according to the present invention.

Below, an embodiment of an electronic control device related to the present invention will be explained referring to the drawings.

FIG. 1 is a cross-sectional view of an electronic control device 10, and FIG. 2 is an enlarged cross-sectional view of a circuit wiring board illustrated in FIG. 1 on which a chip component is mounted.

The electronic control device 10 illustrated in FIG. 1 is used for engine control, motor control, automatic transmission control, and the like of a vehicle such as an automobile for example.

The electronic control device 10 includes a case 3 formed of a case base portion 1 and a case cover portion 2 that seals the case base portion 1. Inside the case 3, a circuit wire board 30, a chip component (electronic component) 41 mounted on the circuit wire board 30, a capacitor module 6, a circuit board for control 4, and a conductor 5 such as a bus bar are stored.

The case base portion 1 and the case cover portion 2 are formed of a metal having a main composition of aluminum, iron and copper, a ceramic, or a resin such as a glass epoxy resin, are fixed by a fastening member and the like not illustrated through a seal member not illustrated, and construct a sealing structure.

Although it is not illustrated, the capacitor module 6 is formed by storing X-capacitors imposed between the phases and Y-capacitors imposed between each phase and a chassis within a capacitor case, and flattens the noise inputted to the circuit board for control 4.

One electrode 6a of the capacitor module 6 is connected to the circuit board for control 4, and the other electrode 6b is connected to the circuit wiring board 30. The circuit board for control 4 and the circuit wiring board 30 are connected to each other by the conductor 5.

The circuit wiring board 30 includes a base board 38 formed of a metal having the main composition of aluminum, iron and copper or a resin, an insulation layer 37 formed on one surface of the base board 38, and plural wiring patterns 31 formed on the insulation layer 37.

The chip component 41 is a passive element such as a capacitor and a resistor, and includes a pair of electrodes 41a, 41b on both end sides. The electrodes 41a, 41b are mounted on lands 33a, 33b (refer to FIG. 3) of the wiring patterns 31 respectively, and are soldered by solder 42. The solder 42 is formed of a material not containing lead (lead-free) such as SnAgCu for example.

Figure 3A:
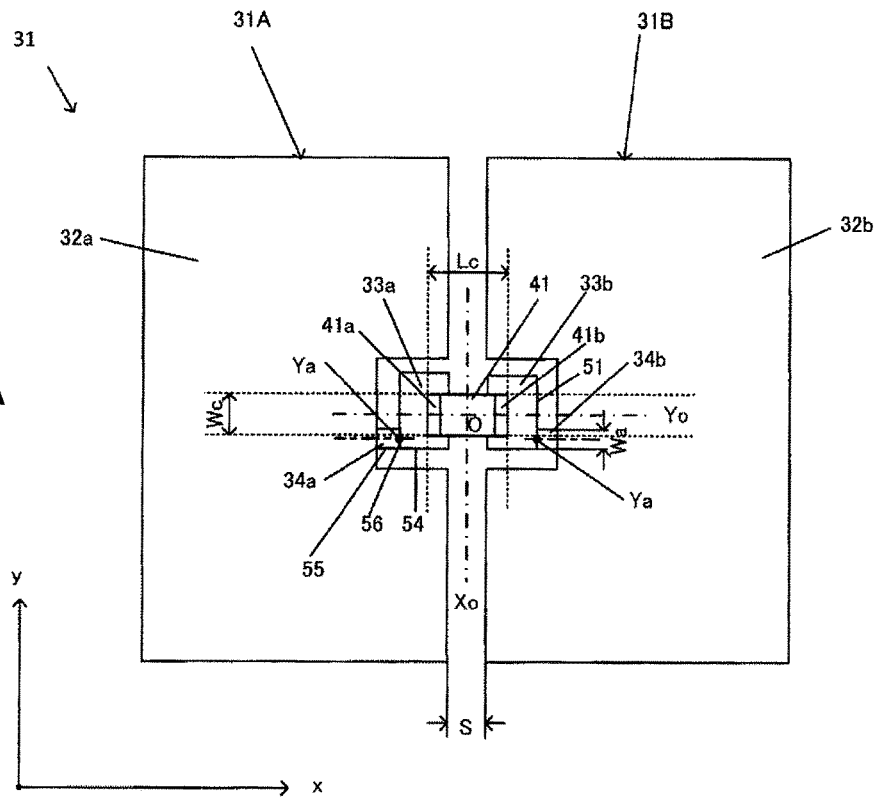
FIGS. 3A and 3B are plan views of a wiring pattern illustrated in FIG. 2 on which the chip component is mounted as viewed from the top.
Figure 3B:
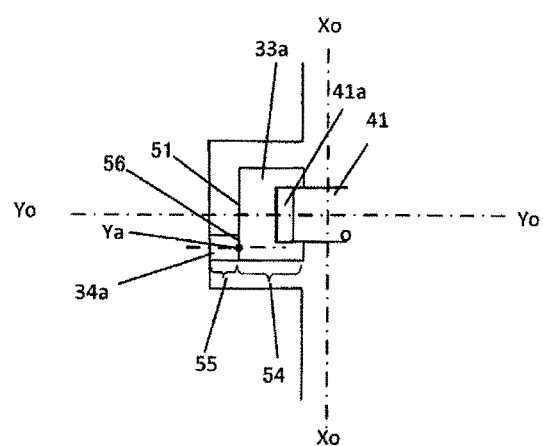

FIG. 3(a) is a plan view of the wiring pattern 31 illustrated in FIG. 2 on which the chip component 41 is mounted as viewed from the top, and FIG. 3(b) is an enlarged view of the region IIIb of FIG. 3(a).

Also, on the insulation layer 37, a number of wiring patterns are formed to which an active component such as a MOSFET for switching and a number of chip components are connected, however, below, one chip component 41 and a pair of wiring patterns 31A, 31B to which this chip component is soldered will be explained.

In FIGS. 3(a), 3(b), the reference sign Xo is a straight line extending in the y-direction and passing through the center O of the chip component 41, and is referred to as the center line Xo in the present description. Also, the reference sign Yo is a straight line extending in the x-direction and passing through the center O of the chip component 41, and is referred to as the center line Yo in the present description. Also, in FIGS. 3(a), 3(b), the y-direction is the transverse direction of the chip component 41, and is referred to also as the chip transverse direction. The x-direction is the longitudinal direction of the chip component 41, and is referred to also as the chip longitudinal direction.

The wiring pattern 31A includes a pattern portion 32a, the land 33a, and a wiring portion 34a that connects the pattern portion 32a and the land 33a to each other. The pattern portion 32a has a large area, and is wound around into a predetermined shape on the base board 38. Similarly, the wiring pattern 31B includes a pattern portion 32b, the land 33b, and a wiring portion 34b that connects the pattern portion 32b and the land 33b to each other. The pattern portion 32b has a large area, and is wound around into a predetermined shape on the base board 38.

The chip component 41 has a predetermined length Lc in the x-direction (the chip component longitudinal direction) and a predetermined width Wc in the y-direction (the chip component transverse direction), and has a rectangular shape in the plan view in which the length Lc is larger than the width Wc. The width Wc of the chip component 41 is smaller than the length in the y-direction of the lands 33a, 33b.

The land 33a and the land 33b are disposed so as to be apart from each other by the interval S in the x-direction, and the electrodes 41a, 41b of the chip component 41 are placed on the lands 33a, 33b respectively and are soldered by the solder 42. In FIGS. 3(a), 3(b), illustration of the solder 42 is omitted to make the drawing clear.

The lands 33a, 33b are formed into a same shape and a same size, have a rectangular shape of 1.4 mm×1.1 mm for example in the plan view, and are formed into a rectangular shape in which the length Lc in the x-direction is shorter than the length in the y-direction. The length in the y-direction of the lands 33a, 33b is formed to be shorter than that of the wiring patterns 31A, 31B respectively.

The wiring portion 34a and the wiring portion 34b are formed into a same shape and a same size, and the width Wa that is the length in the y-direction is made shorter than the length in the y-direction of the land 33a respectively. The width Wa of the wiring portions 34a, 34b is 0.4 mm for example. The lateral side in the outermost side in the y-direction of the wiring portions 34a, 34b is expressed by a reference sign 55, and is referred to as a wiring portion y-direction outermost lateral side. Also, the lateral side that is outermost in the y-direction of the lands 33a, 33b is expressed by a reference sign 54, and is referred to as a land y-direction outermost lateral side.

With respect to the chip component 41, the center O thereof is disposed generally on the center line of the interval S between the lands. The land 33a and the land 33b as well as the wiring portion 34a and the wiring portion 34b are disposed to be line-symmetric with each other respectively with respect to the center line Yo.

The wiring portion 34a and the wiring portion 34b are extended from the land 33a and the land 33b so as to be generally perpendicular to the y-direction, or, in other words, in parallel with the x-direction, and connect the pattern portions 32a, 32b and the lands 33a, 33b to each other respectively. The wiring portions 34a, 34b are connected to lateral sides 51 of the lands 33a, 33b by connection portions 56. The distance from the center line Yo to the land y-direction outermost lateral side 54 and the distance from the center line Yo to the wiring portion y-direction outermost lateral side 55 are equal to each other. In other words, the land y-direction outermost lateral side 54 and the wiring portion y-direction outermost lateral side 55 are arrayed on one straight line.

As illustrated in FIG. 3(b), the center Ya in the y-direction in a line segment 56 (hereinafter referred to also as the connection portion 56) that is the connection portion where the lands 33a, 33b and the wiring portions 34a, 34b contact with each other is disposed outside of a region in which a region of the width Wc of the chip component 41 extends in the x-direction (the chip component longitudinal direction). The center Ya in the y-direction in the connection portion 56 described above is disposed outside of a region in which a region of the length Lc of the chip component 41 extends in the y-direction (the chip component transverse direction).

More specifically, the wiring pattern 31A and the wiring pattern 31B have the configurations described below.

(a) The distance from the center line Yo that extends in the chip component longitudinal direction to the land y-direction outermost lateral side 54 and the distance from the center line Yo to the wiring portion y-direction outermost lateral side 55 are equal to each other. Also, the land 33a and the land 33b as well as the wiring portion 34a and the wiring portion 34b are disposed to be line-symmetric with each other respectively with respect to the center line Xo that extends in the chip component transverse direction.

(b) The wiring portions 34a, 34b are extended in the chip component longitudinal direction that is generally perpendicular to the chip component transverse direction, and connect the pattern portions 32a, 32b and the lands 33a, 33b to each other respectively.

(c) The center Ya in the y-direction of the line segment 56 that is the connection portion of the lands 33a, 33b and the wiring portions 34a, 34b is disposed outside of a region in which a region of the width Wc of the chip component 41 extends in the x-direction (the chip component longitudinal direction). Also, the center Ya in the y-direction of the connection portion 56 is disposed outside of a region in which a region of the length Lc of the chip component 41 extends in the y-direction (the chip component transverse direction).

According to the electronic control device 10 of an embodiment described above, the actions and effects described below are exerted.

(1) The wiring patterns 31A, 31B are formed on the base board 38 through the insulation layer 37. The wiring patterns 31A, 31B are respectively constructed of the pattern portions 32a, 32b, the lands 33a, 33b with the width narrower than that of the pattern portions 32a, 32b, and the wiring portions 34a, 34b with the width narrower than that of the lands 33a, 33b and connecting the pattern portions 32a, 32b and the lands 33a, 33b to each other.

Here, "the lands 33a, 33b with the width narrower than that of the pattern portions 32a, 32b" means that the dimension of the lands 33a, 33b is smaller than the dimension of the pattern portions with respect to both directions of the x-direction and the y-direction, which means that the land area is sufficiently smaller than the area of the pattern portion. Also, "the wiring portions 34a, 34b with the width narrower than that of the lands 33a, 33b" means that the dimension in the y-direction (the chip component transverse direction) of the wiring patterns 34a, 34b is smaller than the dimension with respect to the y-direction (the chip component transverse direction) of the land.

By employing such pattern structure, when the base board 38 and the wiring patterns 31A, 31B expand and shrink due to the temperature change, the insulation layer 37 also deforms by thermal expansion and thermal shrinkage. By this deformation of the insulation layer 37, the stress generated in the solder connection portion can be suppressed. In addition, in the wiring portions 34a, 34b with the width narrower than that of the lands 33a, 33b, the stress generated in the solder connection portion can be absorbed. Therefore, generation of the crack of the solder 42 by a thermal stress can be suppressed.

(2) As described in the configuration (c), the center Ya in the y-direction of the line segment 56 that is the connection portion of the lands 33a, 33b and the wiring portions 34a, 34b is disposed outside of a region in which a region of the width Wc of the chip component 41 extends in the x-direction, and is disposed outside of a region in which a region of the length Lc of the chip component 41 extends in the y-direction.

According to the prior art, the center Ya in the y-direction of the connection portion 56 is disposed within a region in which a region of the width Wc of the chip component 41 extends in the x-direction (the chip component longitudinal direction). In other words, the distances from the wiring portion to the solder connection portions connected to both side surfaces of the chip component 41 are generally equal to each other. Therefore, a large stress is generated in both sides in the width direction of the solder connection portion formed on the land, and the crack is liable to occur in both sides in the width direction of this solder connection portion formed on the land. Although the crack generated in the solder connection portion progresses from both sides in the width direction of the solder connection portion toward the center, because the distance to the position where the crack reaches the center in the width direction of the connection portion and wire breakage occurs is short, the lifetime becomes short which lacks the reliability.

On the other hand, according to an embodiment described above, the center Ya in the width direction of the respective connection portions of the wiring portions 34a, 34b that connect the lands 33a, 33b and the pattern portions 32a, 32b to each other is disposed at a position outside of a region in which a region of the width Wc of the chip component 41 extends in the longitudinal direction of the chip component 41 and a region in which a region of the length Lc of the chip component 41 extends in the transverse direction of the chip component 41. The stress generated in the solder connection portion of both side surfaces in the y-direction of the chip component 41 becomes larger as the distance from the wiring portions 34a, 34b is nearer. In other words, the stress generated in the solder connection portion on the side near from the wiring portions 34a, 34b becomes larger than the stress applied to the solder connection portion on the side farther from the wiring portions 34a, 34b. Therefore, the crack of the solder 42 is liable to be generated in the solder connection portion on the side nearer from the wiring portions 34a, 34b. According to this structure, wire breakage is not caused until the crack generated in in the solder connection portion on the side nearer from the wiring portions 34a, 34b reaches the solder connection portion on the side farther from the wiring portions 34a, 34b. In other words, the length to the position where the solder connection portion causes wire breakage becomes the distance between the solder connection portions in both ends in the y-direction. Therefore, according to the present invention, the distance to the position where wire breakage caused by the crack of the solder 42 occurs becomes long. In other words, the life time until the wire breakage can be made long, and the reliability can be improved.

Also, according to an example of a prior art, because similar cracks are generated in the solder connection portions in both ends in the y-direction and mutually develop, the distance to the position where wire breakage occurs becomes a half of the distance between the solder connection portions in both ends in the y-direction.

(3) In addition to the configuration (c) described above, as described in the configuration (b) described above, the distance to the land y-direction outermost lateral side 54 of the lands 33a, 33b and the distance to the wiring portion y-direction outermost lateral side 55 of the wiring portions 34a, 34b are equal to each other. In other words, the wiring portion y-direction outermost lateral side 55 of the wiring portions 34a, 34b is disposed at the position of the outermost side in the transverse direction of the chip component 41 in the lands 33a, 33b. Because the wiring portions 34a, 34b are disposed at the position of the outermost side in the transverse direction of the chip component 41 thus, the stress generated in the solder connection portion can be reduced.

Also, with respect to the wiring patterns 31A, 31B, various embodiments can be employed as shown below.

Embodiment 2

Figure 4A:
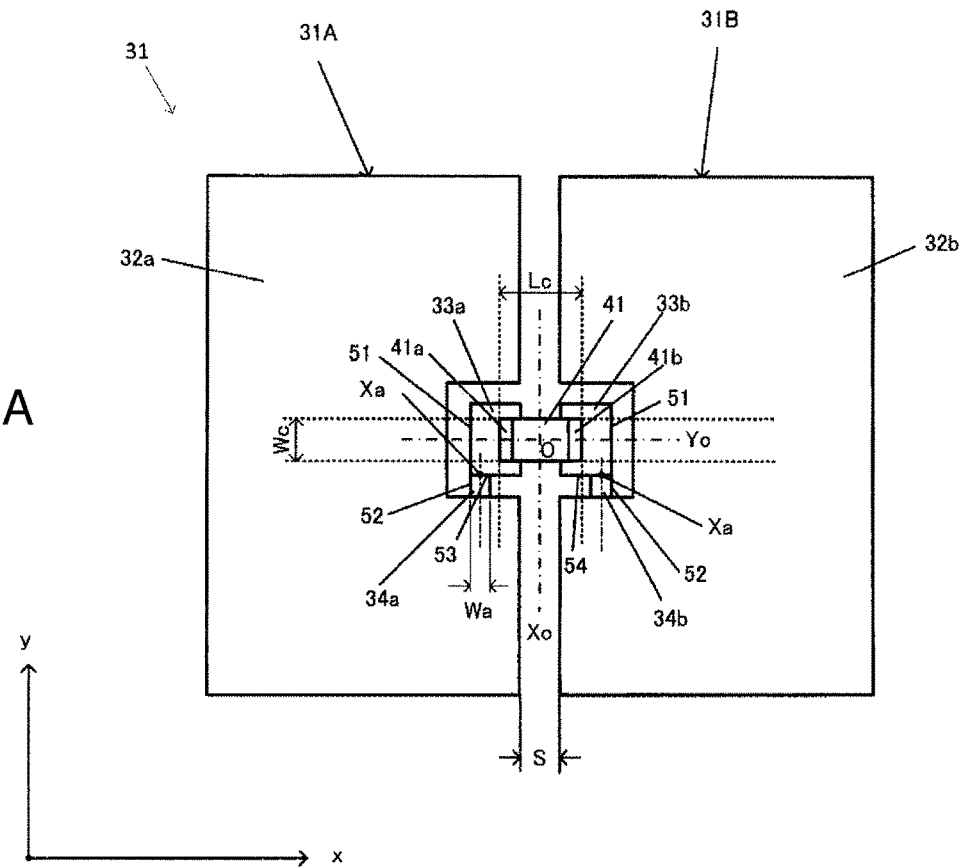
FIGS. 4A and 4B relate to the embodiment 2 of the present invention.
Figure 4B:
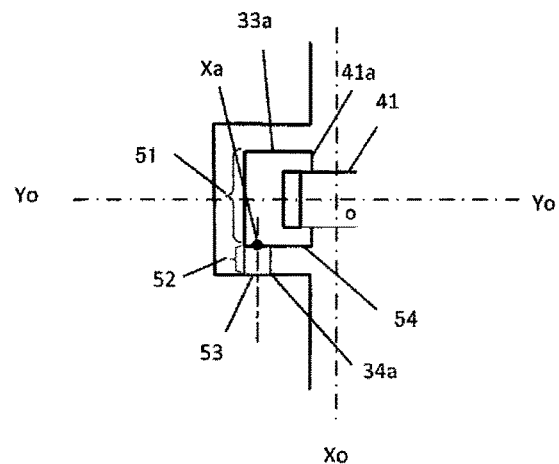

FIG. 4(a) and FIG. 4(b) relate to the embodiment 2 of the present invention, FIG. 4(a) is a plan view of the wiring patterns 31A, 31B on which the chip component 41 is mounted as viewed from the top, and FIG. 4(b) is an enlarged view of the region IVb of FIG. 4(a).

The point of the wiring patterns 31A, 31B of the embodiment 2 different from the embodiment 1 is the point that the wiring portion 34a and the wiring portion 34b are extended in the y-direction from the lateral sides of the lands 33a, 33b, and connect the pattern portions 32a, 32b and the lands 33a, 33b to each other.

More specifically, the wiring pattern 31A and the wiring pattern 31B have the configurations described below.

(a) The land 33a and the land 33b as well as the wiring portion 34a and the wiring portion 34b are formed to be line-symmetric with each other respectively with respect to the center line Xo.

(b) The wiring portions 34a, 34b are extended in the y-direction (the chip transverse direction) that is generally perpendicular to the x-direction (the chip longitudinal direction), and connect the pattern portions 32a, 32b and the lands 33a, 33b to each other. The wiring portions 34a, 34b are connected to the lateral sides 54 of the lands 33a, 33b by connection portions 53. The land lateral side 54 is positioned outermost in the x-direction from the center line Xo out of 4 sides which are the contour lines of the lands 33a, 33b.

(c) The center Xa in the x-direction of a line segment 53 (hereinafter referred to also as the connection portion 53) which is the connection portion of the lands 33a, 33b and the wiring portions 34a, 34b is disposed outside of a region in which a region of the length Lc of the chip component 41 extends in the y-direction. Also, the center Xa in the x-direction of the connection portion 53 is disposed outside of a region in which a region of the width Wc of the chip component 41 extends in the x-direction.

Also, in the embodiment 2, the distance from the center line Xo to the land x-direction outermost lateral side 51 that is outermost in the x-direction and the distance from the center line Xo to a wiring portion x-direction outermost lateral side 52 that is outermost in the x-direction are equal to each other. In other words, the land x-direction outermost lateral side 51 and the wiring portion x-direction outermost lateral side 52 are positioned on a same straight line.

Because the other configurations in the embodiment 2 are similar to those of the embodiment 1, explanation thereof will be omitted.

With respect to the crack of the solder 42, the embodiment 2 is similar to the embodiment 1, and the effect similar to that of the embodiment 1 is exerted in the embodiment 2 also.

Embodiment 3

Figure 5:
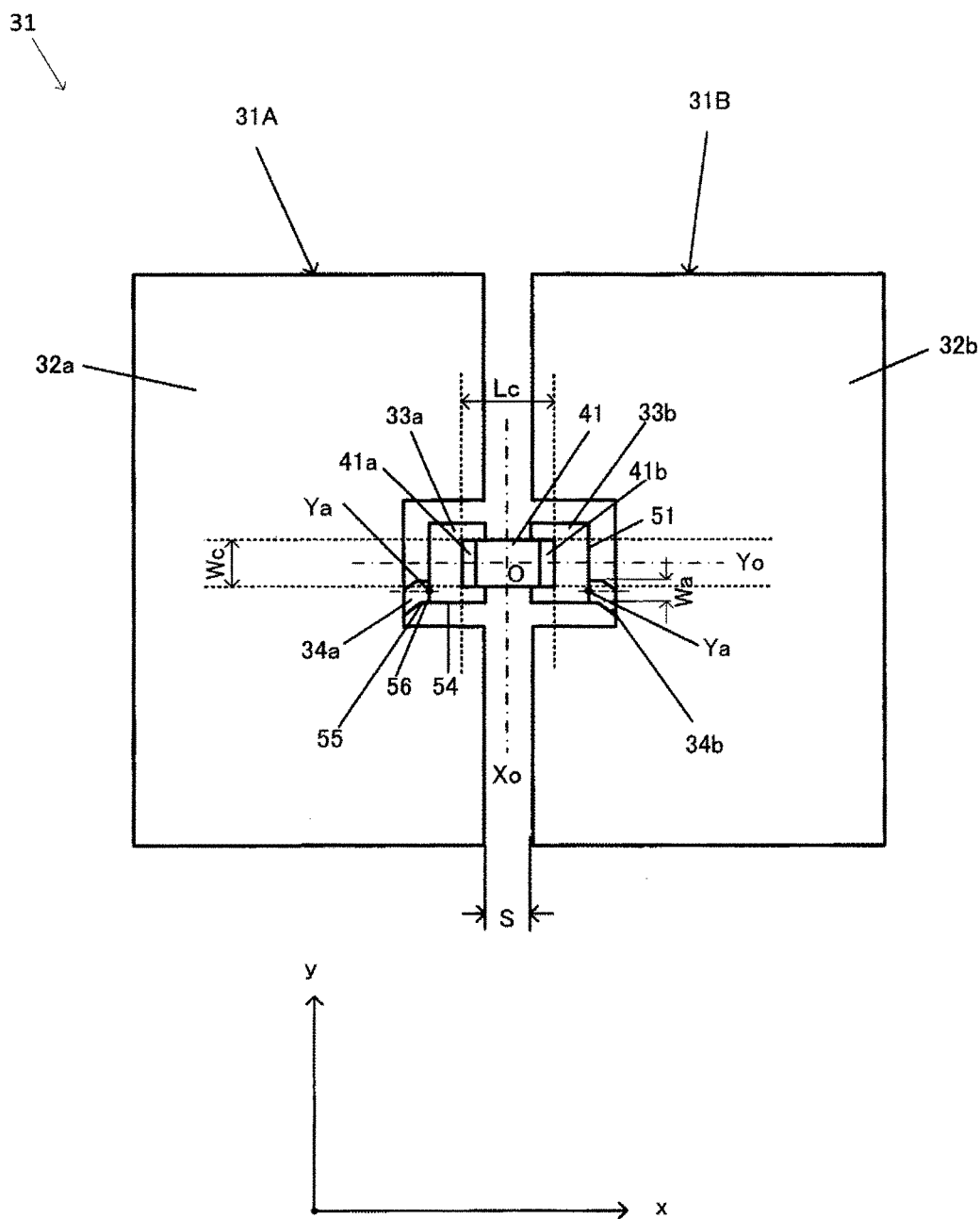
FIG. 5 relates to the embodiment 3 of the present invention, and is a plan view of a wiring pattern on which a chip component is mounted as viewed from the top.

FIG. 5 relates to the embodiment 3 of the present invention, and is a plan view of the wiring patterns 31A, 31B on which the chip component 41 is mounted as viewed from the top.

The point of the wiring patterns 31A, 31B of the embodiment 3 different from the embodiment 2 is the point that the wiring portion 34a and the wiring portion 34b respectively have inclined portions.

The wiring portions 34a, 34b respectively include a straight line portion and an inclined portion, the straight line portion is extended in the x-direction from the connection portion 56 with the lands 33a, 33b, and the inclined portion is arranged to continue to the straight line portion and connects the pattern portions 32a, 32b and the lands 33a, 33b to each other. The inclined portion is inclined in the direction of gradually departing from the lands 33a, 33b toward the pattern portions 32a, 32b.

Because the other configurations in the embodiment 3 are similar to those of the embodiment 2, explanation thereof will be omitted.

In the embodiment 3, the land 33a and the land 33b as well as the wiring portion 34a and the wiring portion 34b are formed to be line-symmetric with each other respectively with respect to the center line Xo. Also, in the embodiment 3, the center Ya in the y-direction of the connection portion 56 is disposed outside of a region in which a region of the width Wc of the chip component 41 extends in the x-direction and a region in which a region of the length Lc of the chip component 41 extends in the y-direction. Also, the connection portion 56 is connected to the land x-direction outermost lateral side 51 that is outermost in the x-direction of the lands 33a, 33b.

Therefore, the embodiment 3 also exerts the effect similar to that of the embodiments 1, 2.

Embodiment 4

Figure 6:
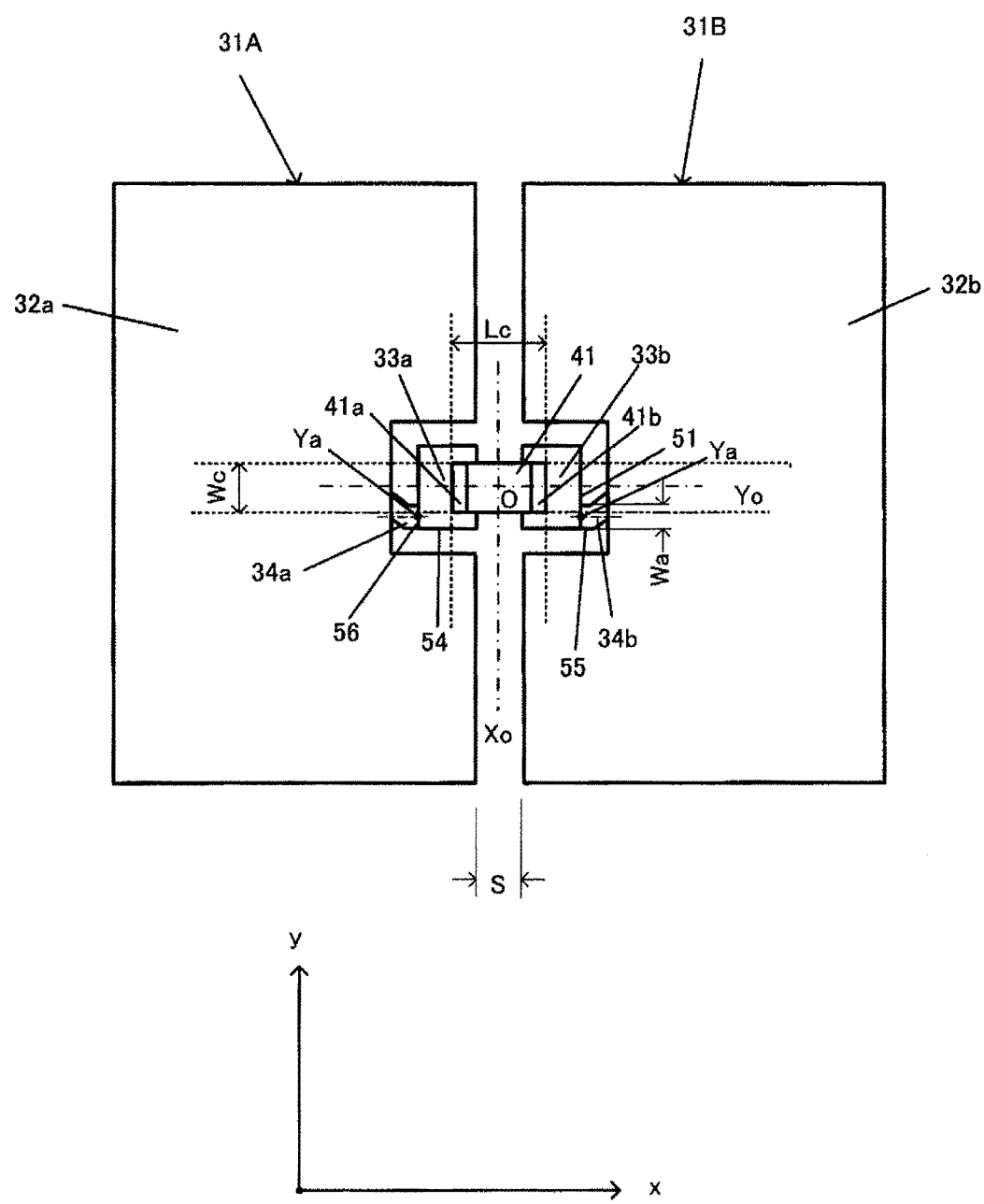
FIG. 6 relates to the embodiment 4 of the present invention, and is a plan view of a wiring pattern on which a chip component is mounted as viewed from the top.

FIG. 6 relates to the embodiment 4 of the present invention, and is a plan view of the wiring patterns 31A, 31B on which the chip component 41 is mounted as viewed from the top.

The point of the wiring patterns 31A, 31B of the embodiment 4 different from the embodiment 3 is the point that the inclined portion of the wiring portions 34a, 34b are inclined to the opposite direction to the inclined portion of the embodiment 3.

The wiring portions 34a, 34b respectively include a straight line portion and an inclined portion, the straight line portion is extended in the x-direction from the connection portion 56 with the lands 33a, 33b, and the inclined portion is arranged to continue to the straight line portion and connects the pattern portions 32a, 32b and the lands 33a, 33b to each other similarly to the embodiment 2. The inclined portion is inclined to the direction of gradually approaching the center line Yo.

Because the other configurations in the embodiment 4 are similar to those of the embodiment 3, explanation thereof will be omitted.

In the embodiment 4, the land 33a and the land 33b as well as the wiring portion 34a and the wiring portion 34b are formed to be line-symmetric with each other respectively with respect to the center line Xo. Also, in the embodiment 4, the center Ya in the y-direction of the connection portion 56 is disposed outside of a region in which a region of the width Wc of the chip component 41 extends in the x-direction and a region in which a region of the length Lc of the chip component 41 extends in the y-direction. Also, the connection portion 56 is connected to the land x-direction outermost lateral side 51 that is outermost in the x-direction of the lands 33a, 33b.

Therefore, the embodiment 4 also exerts the effect similar to that of the embodiments 1-3.

Embodiment 5

Figure 7:
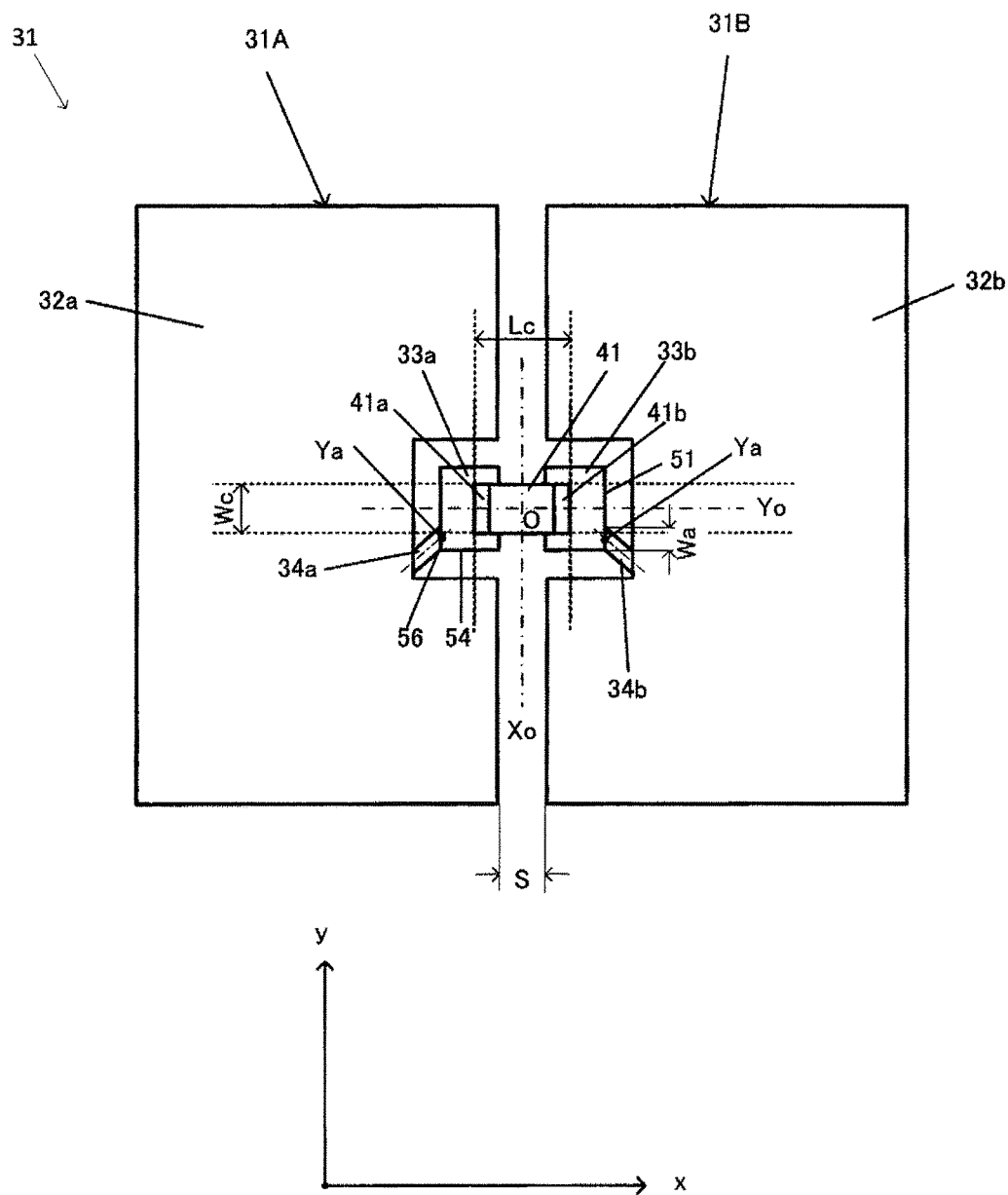
FIG. 7 relates to the embodiment 5 of the present invention, and is a plan view of a wiring pattern on which a chip component is mounted as viewed from the top.

FIG. 7 relates to the embodiment 5 of the present invention, and is a plan view of the wiring patterns 31A, 31B on which the chip component 41 is mounted as viewed from the top.

The point of the wiring patterns 31A, 31B of the embodiment 5 different from the embodiment 3 shown in FIG. 5 is the point that the wiring portion 34a and the wiring portion 34b are inclined over the entire length.

In the embodiment 5 also, the land 33a and the land 33b as well as the wiring portion 34a and the wiring portion 34b are formed to be line-symmetric with each other respectively with respect to the center line Xo.

The wiring portions 34a, 34b are extended respectively from the land connection portion 56 incliningly, and connect the pattern portions 32a, 32b and the lands 33a, 33b to each other.

The wiring portions 34a, 34b are formed so as to incline from the connection portion 56 toward the pattern portions 32a, 32b to the direction of gradually departing from the center line Yo.

In the embodiment 5 also, the connection portion 56 of the wiring portions 34a, 34b connected to the lands 33a, 33b is in a positional relation same to that of the embodiments 3, 4. More specifically, the center Ya in the y-direction of the connection portion 56 is disposed outside of a region in which a region of the width Wc of the chip component 41 extends in the x-direction and a region in which a region of the length Lc of the chip component 41 extends in the y-direction. Also, the connection portion 56 is connected to the portion outermost in the y-direction of the land x-direction outermost lateral side 51 that is outermost in the x-direction of the lands 33a, 33b.

Because the other configurations in the embodiment 5 are similar to those of the embodiments 3, 4, explanation thereof will be omitted. Therefore, the embodiment 5 also exerts the effect similar to that of the embodiments 1-4.

Embodiment 6

Figure 8:
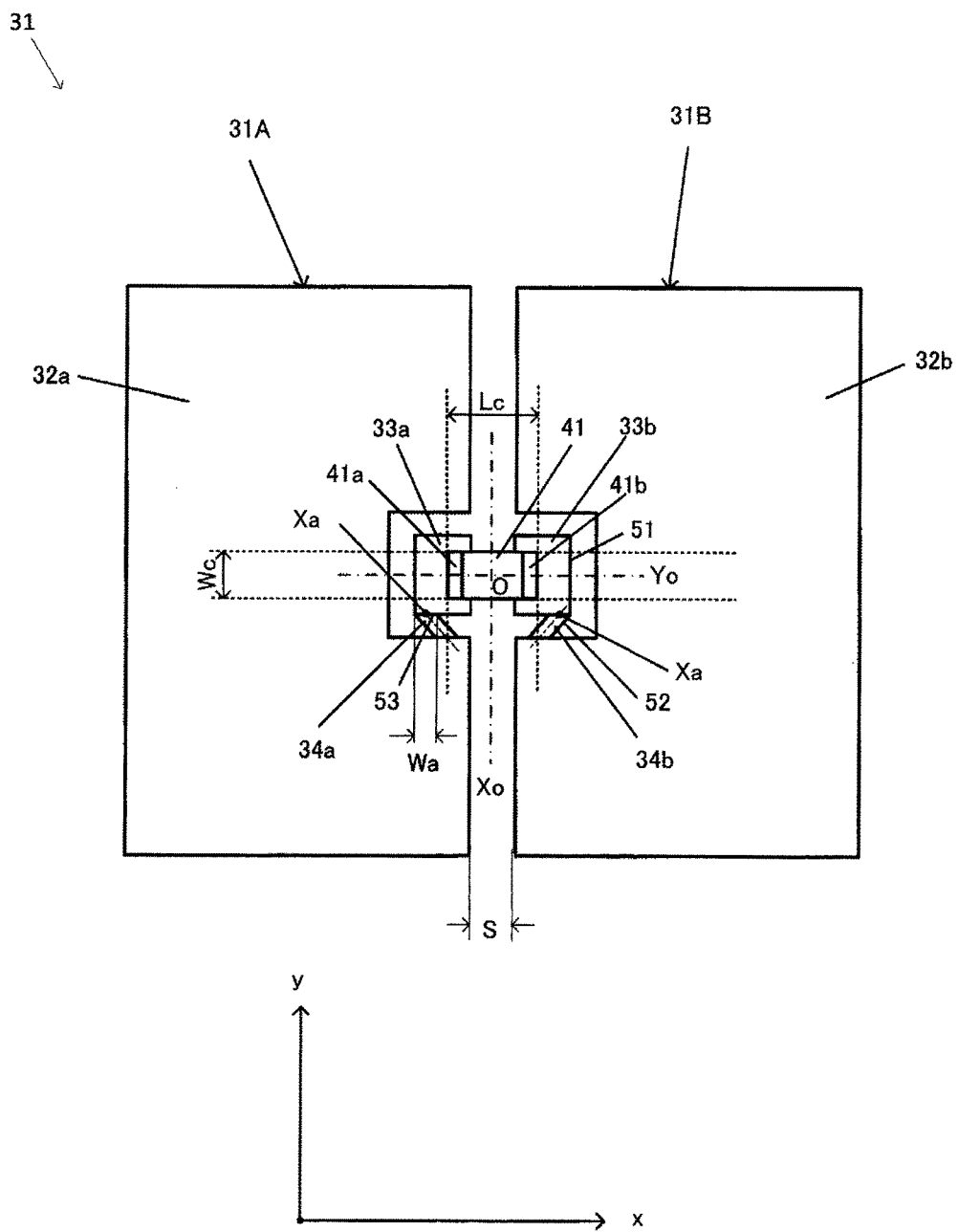
FIG. 8 relates to the embodiment 6 of the present invention, and is a plan view of a wiring pattern on which a chip component is mounted as viewed from the top.

FIG. 8 relates to the embodiment 6 of the present invention, and is a plan view of the wiring patterns 31A, 31B on which the chip component 41 is mounted as viewed from the top.

The point of the wiring patterns 31A, 31B of the embodiment 6 different from the embodiment 1 shown in FIG. 3 is the point that the wiring portions 34a, 34b are extended incliningly from the connection portion 53, and connect the pattern portions 32a, 32b and the lands 33a, 33b to each other.

The wiring portions 34a, 34b are formed so as to incline from the connection portion 53 toward the pattern portions 32a, 32b to the direction of gradually approaching the center line Xo.

The land 33a and the land 33b as well as the wiring portion 34a and the wiring portion 34b are formed to be line-symmetric with each other respectively with respect to the center line Xo.

In the embodiment 6, the center Xa in the x-direction of the connection portion 53 is disposed outside of a region in which a region of the width Wc of the chip component 41 extends in the x-direction and a region in which a region of the length Lc of the chip component 41 extends in the y-direction. Also, the connection portion 53 is connected to the portion outermost in the x-direction of the land y-direction outermost lateral side 54 that is outermost in the y-direction of the lands 33a, 33b.

Because the other configurations in the embodiment 6 are similar to those of the embodiment 1, explanation thereof will be omitted. Therefore, the embodiment 6 also exerts the effect similar to that of the embodiments 1-5.

Embodiment 7

Figure 9:
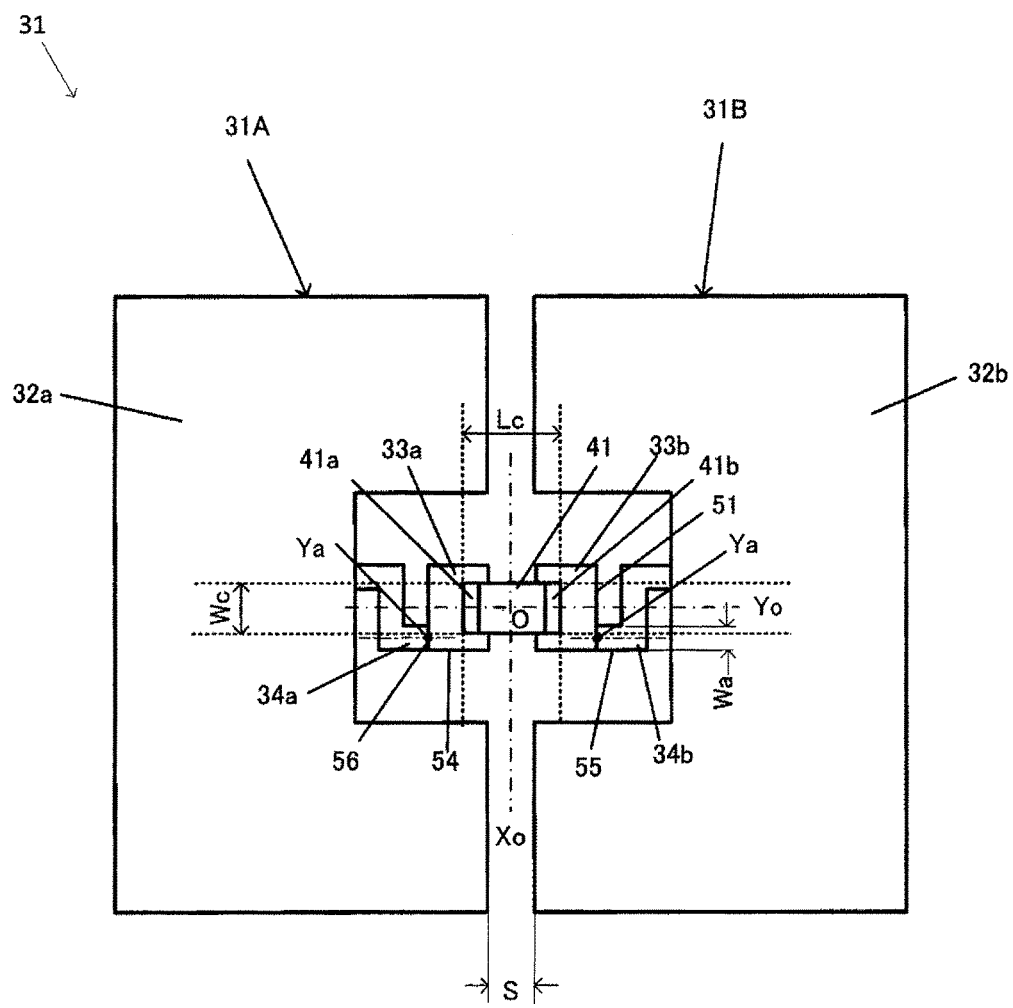
FIG. 9 relates to the embodiment 7 of the present invention, and is a plan view of a wiring pattern on which a chip component is mounted as viewed from the top.

FIG. 9 relates to the embodiment 7 of the present invention, and is a plan view of the wiring patterns 31A, 31B on which the chip component 41 is mounted as viewed from the top.

The point of the wiring patterns 31A, 31B of the embodiment 7 different from the embodiment 4 shown in FIG. 6 is the point that the wiring portion 34a and the wiring portion 34b include not the inclined portion but a step-like routing portion.

However, in the embodiment 7, the connection portion 56 of the wiring portions 34a, 34b connected to the lands 33a, 33b is in a positional relation same to that of the embodiment 4. More specifically, the center Ya in the y-direction of the connection portion 56 is disposed outside of a region in which a region of the width Wc of the chip component 41 extends in the x-direction and a region in which a region of the length Lc of the chip component 41 extends in the y-direction. Also, the connection portion 56 is connected to the land x-direction outermost lateral side 51 that is outermost in the x-direction of the lands 33a, 33b. Further, in the embodiment 7, the land 33a and the land 33b as well as the wiring portion 34a and the wiring portion 34b are formed to be line-symmetric with each other respectively with respect to the center line Xo.

Because the other configurations in the embodiment 7 are similar to those of the embodiment 2, explanation thereof will be omitted.

Therefore, the embodiment 7 also exerts the effect similar to that of the embodiments 1-6.

Embodiment 8

Figure 10:
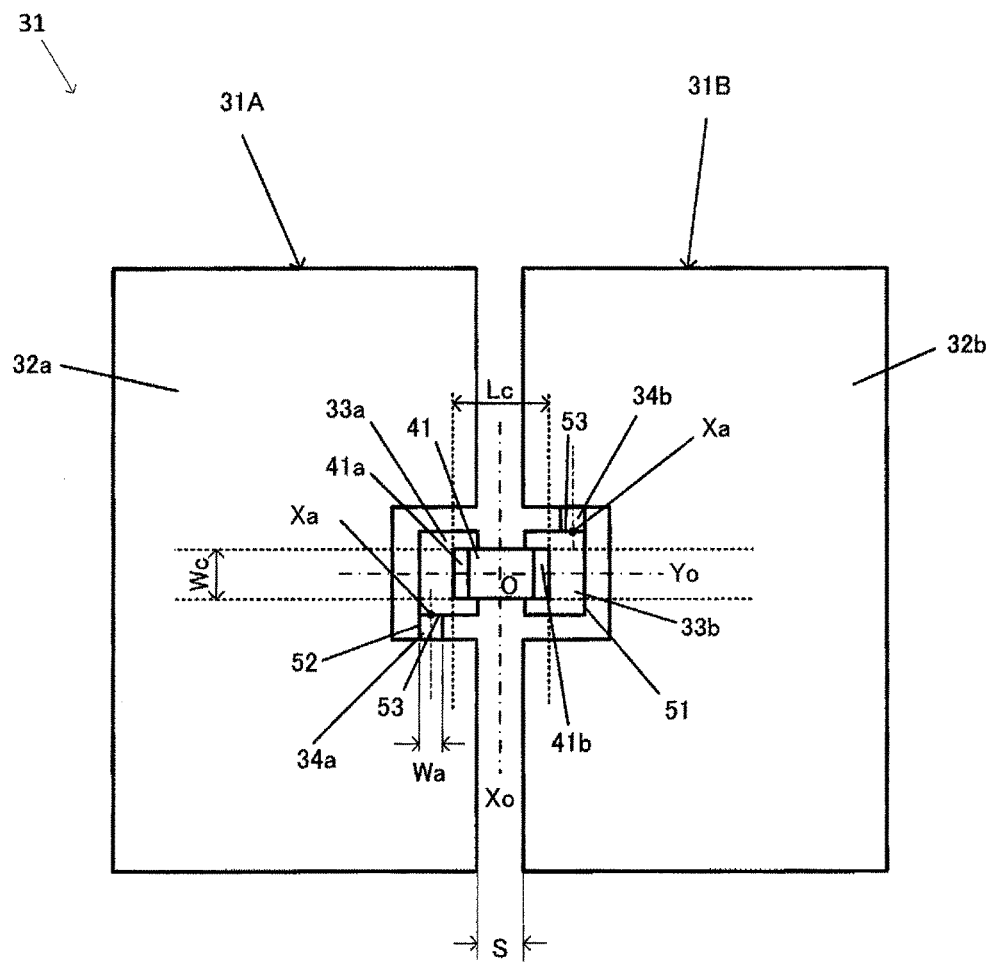
FIG. 10 relates to the embodiment 8 of the present invention, and is a plan view of a wiring pattern on which a chip component is mounted as viewed from the top.

FIG. 10 relates to the embodiment 8 of the present invention, and is a plan view of the wiring patterns 31A, 31B on which the chip component 41 is mounted as viewed from the top.

Differently from the embodiments 1-7, the wiring portion 34a of the wiring pattern 31A and the wiring portion 34b of the wiring pattern 31B in the embodiment 8 are formed to be point-symmetric with each other with respect to the center O of the chip component 41.

The connection portion 53 of the wiring portion 34a connected to the land 33a and the connection portion 53 of the wiring portion 34b connected to the land 33b are disposed at the positions becoming symmetric with each other with respect to the center line Xo and the center line Yo. However, the centers Xa in the x-direction of the connection portions 53 are respectively disposed outside of a region in which a region of the width Wc of the chip component 41 extends in the x-direction and a region in which a region of the length Lc of the chip component 41 extends in the y-direction. Also, the x-direction outermost lateral sides 52 which are the wiring portions of outermost in the x-direction of the wiring portions 34a, 34b are on the straight lines same to the land x-direction outermost lateral sides 51 which are outermost in the x-direction of the lands 33a, 33b respectively. Because the other configurations in the embodiment 8 are similar to those of the embodiment 2, explanation thereof will be omitted. Therefore, the embodiment 8 also exerts the effect similar to that of the embodiments 1-7.

Embodiment 9

Figure 11:
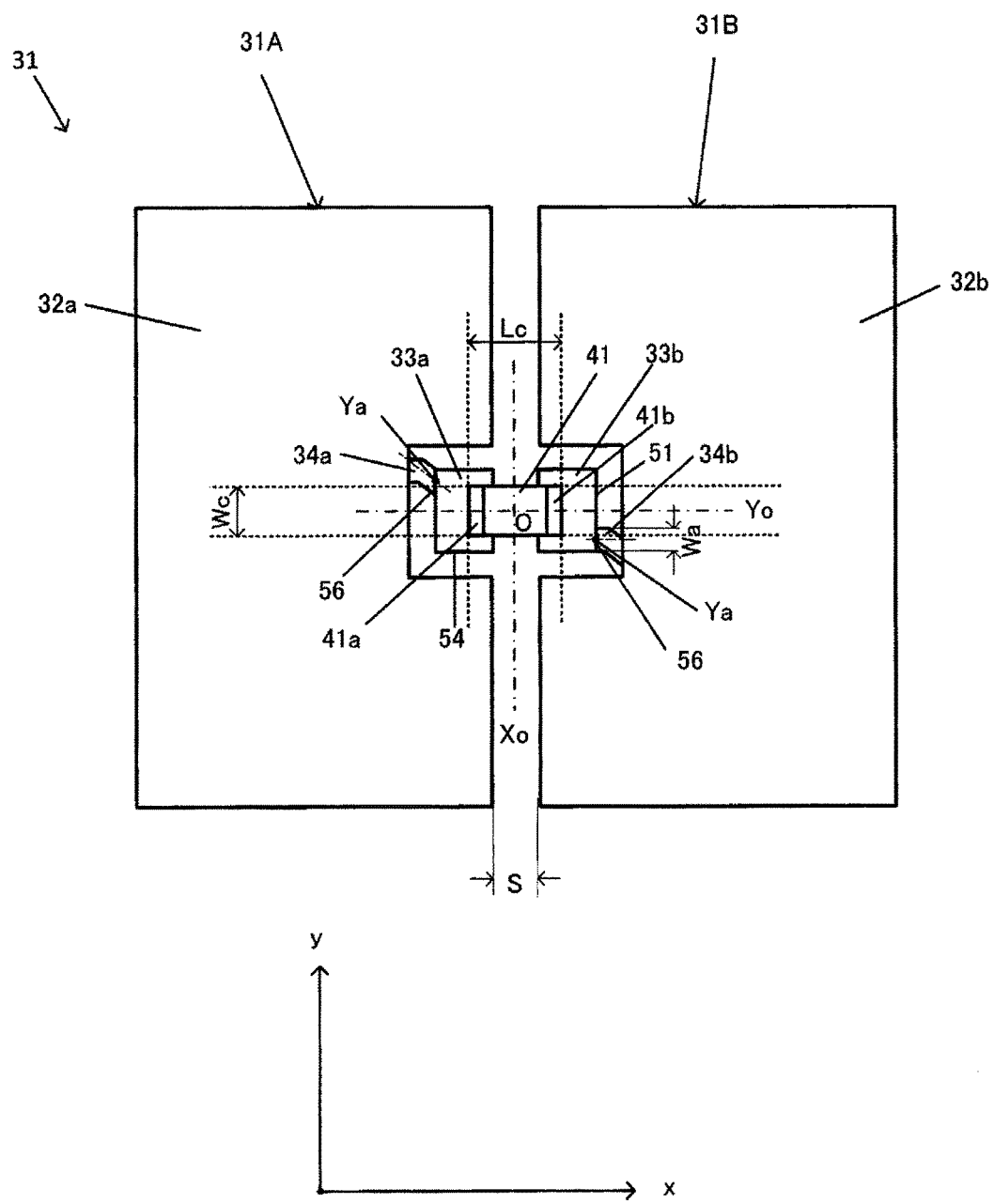
FIG. 11 relates to the embodiment 9 of the present invention, and is a plan view of a wiring pattern on which a chip component is mounted as viewed from the top.

FIG. 11 relates to the embodiment 9 of the present invention, and is a plan view of the wiring patterns 31A, 31B on which the chip component 41 is mounted as viewed from the top.

In the embodiment 9 also, the wiring portion 34a of the wiring pattern 31A and the wiring portion 34b of the wiring pattern 31B are formed to be point-symmetric with each other with respect to the center O of the chip component 41.

The wiring portions 34a, 34b are connected to the land x-direction outermost lateral sides 51 which are outermost in the x-direction of the lands 33a, 33b respectively. The wiring portions 34a, 34b respectively include the inclined portion and the straight line portion, the inclined portion is extended obliquely from the lands 33a, 33b, and the straight line portion arranged so as to continue to the end of the inclined portion in the x-direction is connected to the wiring patterns 31A, 31B.

In the embodiment 9, the connection portion 56 of the wiring portions 34a, 34b connected to the lands 33a, 33b is in a positional relation same to that of the embodiment 4 shown in FIG. 6. More specifically, the centers Ya in the y-direction of the connection portion 56 are respectively disposed outside of a region in which a region of the width Wc of the chip component 41 extends in the x-direction and a region in which a region of the length Lc of the chip component 41 extends in the y-direction. Also, the connection portion 56 is connected to the lateral side 51 that is outermost in the x-direction of the lands 33a, 33b.

Because the other configurations in the embodiment 9 are similar to those of the embodiment 4, explanation thereof will be omitted. Therefore, the embodiment 9 also exerts the effect similar to that of the embodiments 1-8.

Embodiment 10

Figure 12:
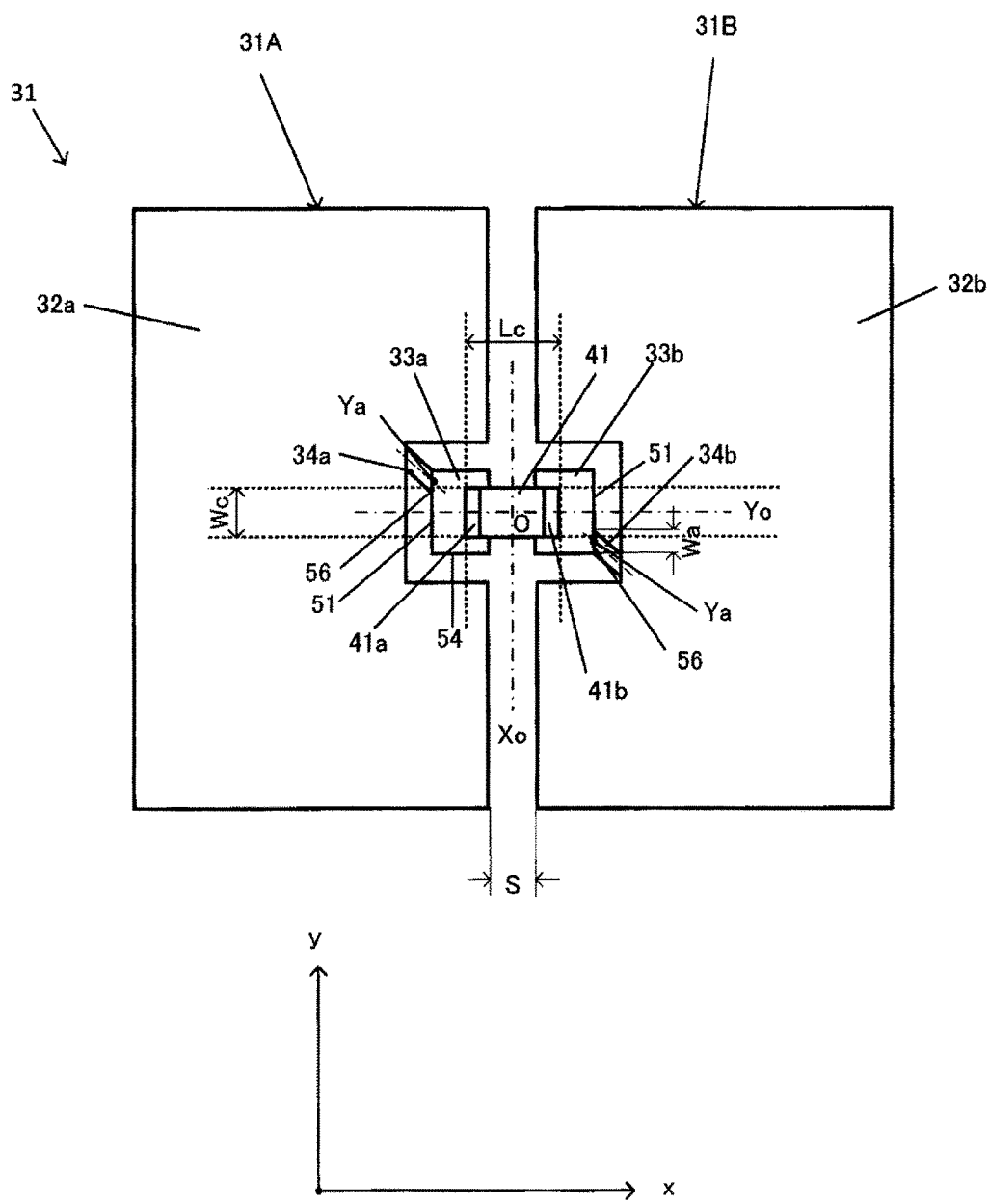
FIG. 12 relates to the embodiment 10 of the present invention, and is a plan view of a wiring pattern on which a chip component is mounted as viewed from the top.

FIG. 12 relates to the embodiment 10 of the present invention, and is a plan view of the wiring patterns 31A, 31B on which the chip component 41 is mounted as viewed from the top.

The embodiment 10 is different from the embodiment 9 in the point that the wiring portions 34a, 34b of the wiring patterns 31A, 31B are formed of the incline portion only.

The wiring portions 34a, 34b respectively include the inclined portion, and the pattern portions 32a, 32b and the lands 33a, 33b are connected to each other by this inclined portion. The wiring portion 34a and the wiring portion 34b are formed to be point-symmetric with each other with respect to the center O of the chip component 41.

In the embodiment 10 also, the center Ya in the y-direction of the connection portion 56 is disposed outside of a region in which a region of the width Wc of the chip component 41 extends in the x-direction and a region in which a region of the length Lc of the chip component 41 extends in the y-direction. Also, the connection portion 56 is connected to the land x-direction outermost lateral side 51 that is outermost in the x-direction of the lands 33a, 33b.

Because the other configurations in the embodiment 10 are similar to those of the embodiment 4, explanation thereof will be omitted. Therefore, the embodiment 10 also exerts the effect similar to that of the embodiments 1-9.

Embodiment 11

Figure 13:
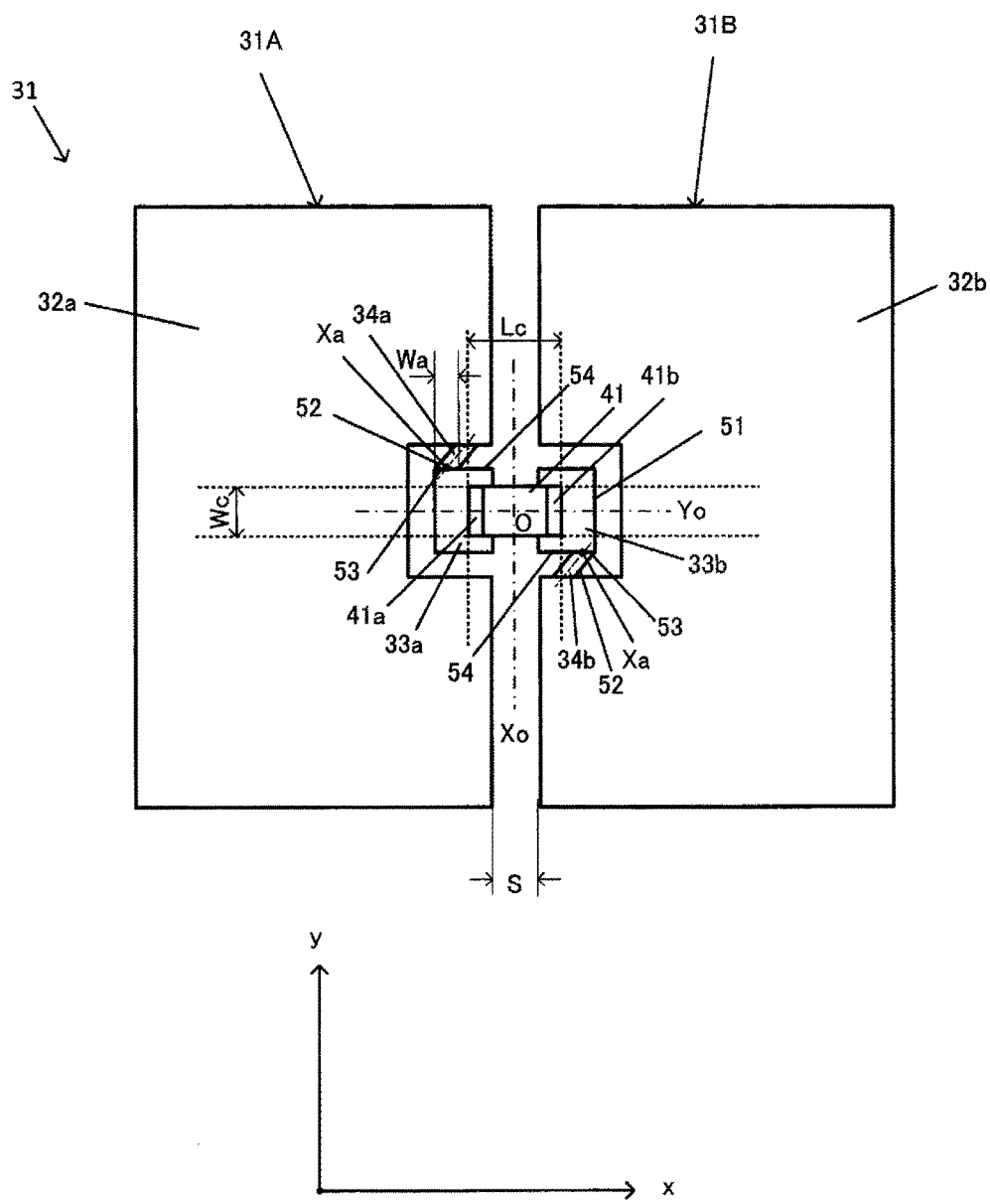
FIG. 13 relates to the embodiment 11 of the present invention, and is a plan view of a wiring pattern on which a chip component is mounted as viewed from the top.

FIG. 13 relates to the embodiment 11 of the present invention, and is a plan view of the wiring patterns 31A, 31B on which the chip component 41 is mounted as viewed from the top.

The embodiment 11 is same to the embodiment 10 in the point that the wiring portions 34a, 34b of the wiring patterns 31A, 31B are formed of the inclined portion only, but is different from the embodiment 10 in the point that the wiring portions 34a, 34b are connected to the land y-direction outermost lateral side 54 that is outermost in the y-direction of the lands 33a, 33b.

In the embodiment 11, the wiring portions 34a, 34b respectively include the inclined portion, and the pattern portions 32a, 32b and the lands 33a, 33b are connected to each other by this inclined portion. The wiring portion 34a and the wiring portion 34b are formed to be point-symmetric with each other with respect to the center O of the chip component 41.

In the embodiment 11 also, the center Xa in the x-direction of the connection portion 53 is disposed outside of a region in which a region of the width Wc of the chip component 41 extends in the x-direction and a region in which a region of the length Lc of the chip component 41 extends in the y-direction. Also, the connection portion 53 is connected to the portion outermost in the x-direction of the land y-direction outermost lateral side 54 that is outermost in the y-direction of the lands 33a, 33b.

Because the other configurations in the embodiment 11 are similar to those of the embodiment 1, explanation thereof will be omitted. Therefore, the embodiment 11 also exerts the effect similar to that of the embodiments 1-10.

Embodiment 12

Figure 14:
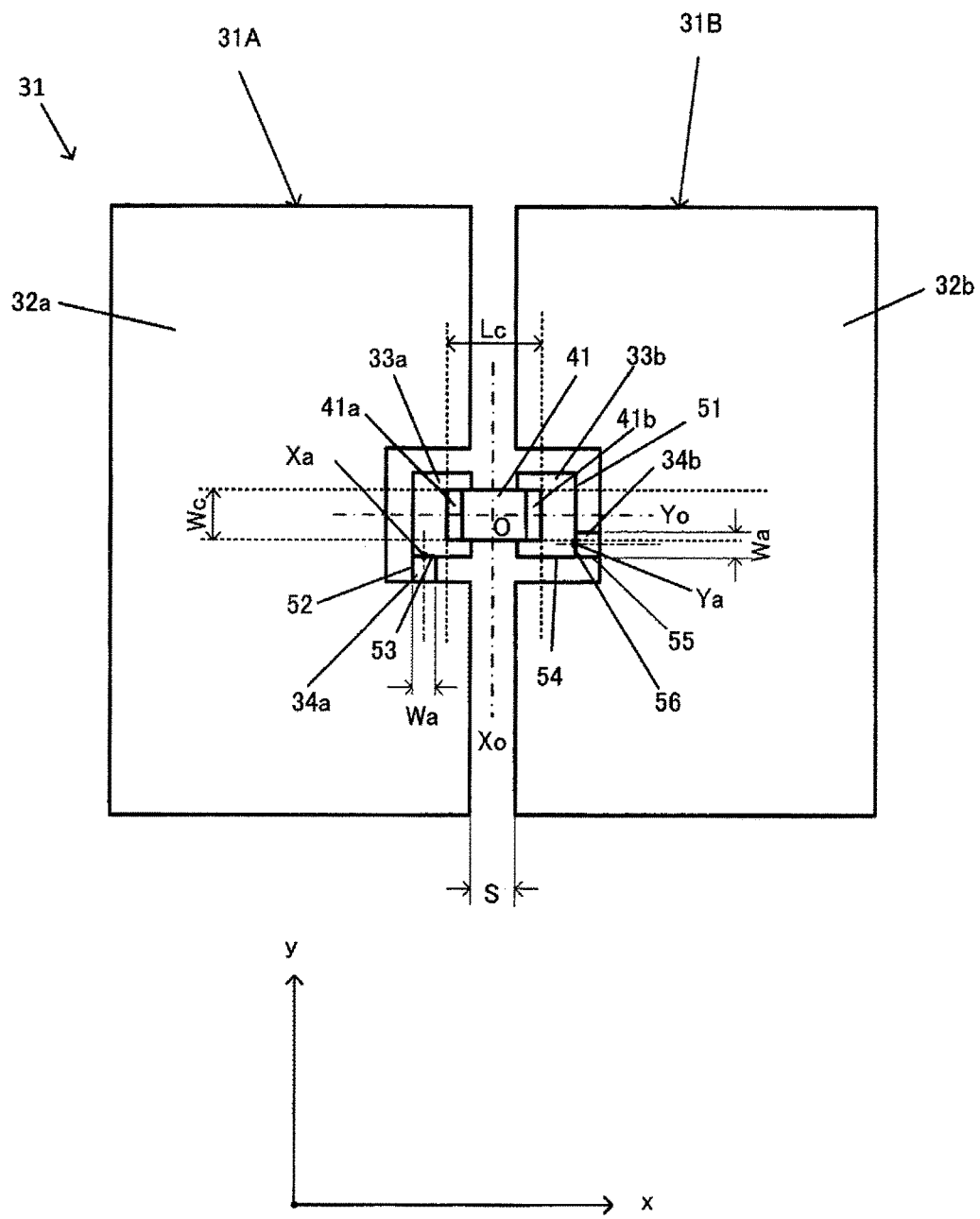
FIG. 14 relates to the embodiment 12 of the present invention, and is a plan view of a wiring pattern on which a chip component is mounted as viewed from the top.

FIG. 14 relates to the embodiment 12 of the present invention, and is a plan view of the wiring patterns 31A, 31B on which the chip component 41 is mounted as viewed from the top.

In the embodiment 12, the wiring portion 34a of the wiring pattern 31A and the wiring portion 34b of the wiring pattern 31B are disposed at the positions asymmetric with each other with respect to the center O of the chip component 41.

In the embodiment 12, the wiring portion 34a is connected to the land y-direction outermost lateral side 54 that is outermost in the y-direction of the land 33a at the connection portion 53. The wiring portion x-direction outermost lateral side 52 that is outermost in the x-direction of the wiring portion 34a is on the straight line same to the land x-direction outermost lateral side 51 that is outermost in the x-direction of the land 33a.

The wiring portion 34b is connected to the land x-direction outermost lateral side 51 that is outermost in the x-direction of the land 33b at the connection portion 56. The land y-direction outermost lateral side 54 that is outermost in the y-direction of the land 33b is on the straight line same to the wiring portion y-direction outermost lateral side 55 that is outermost in the y-direction of the wiring portion 34b.

The center Xa in the x-direction of the connection portion 53 of the wiring portion 34a and the center Ya in the y-direction of the connection portion 56 of the wiring portion 34b are respectively disposed outside of a region in which a region of the width Wc of the chip component 41 extends in the x-direction and a region in which a region of the length Lc of the chip component 41 extends in the y-direction.

The other configurations of the embodiment 12 are similar to those of the embodiment 1.

Therefore, in the embodiment 12 also, the effect similar to that of the embodiments 1-11 is exerted.

Embodiment 13

Figure 15:
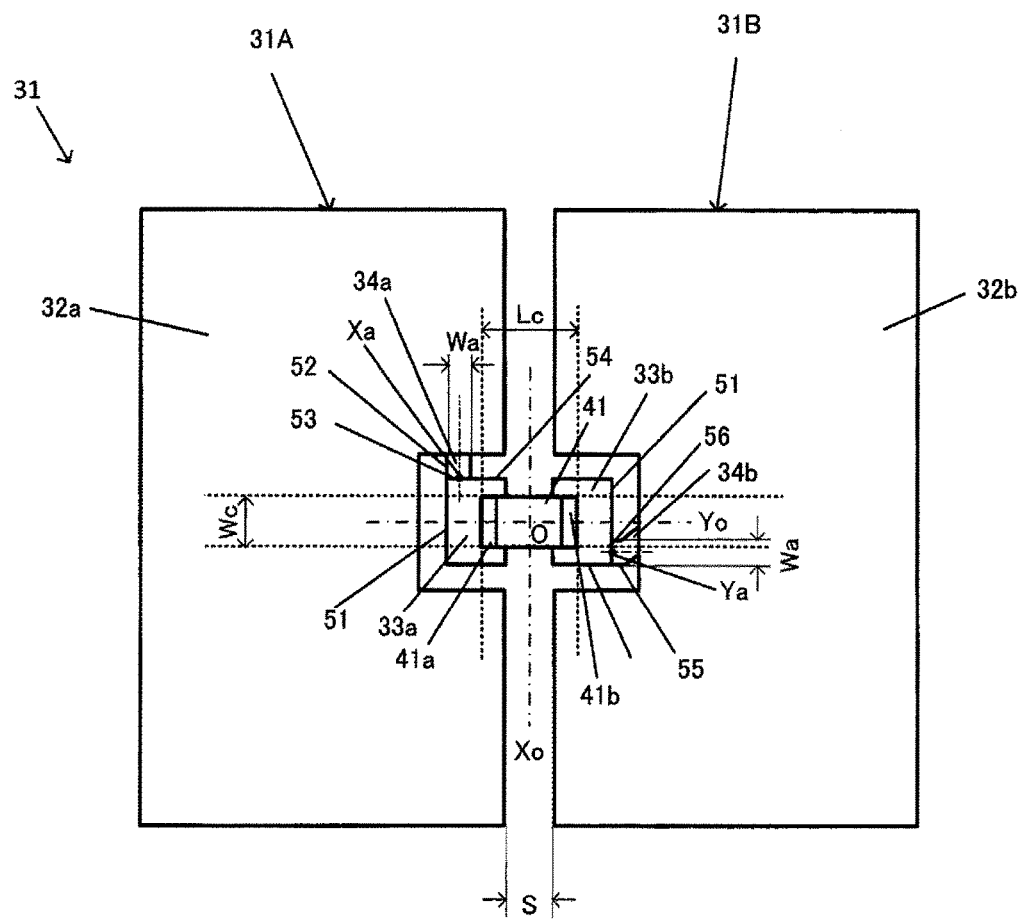
FIG. 15 relates to the embodiment 13 of the present invention, and is a plan view of a wiring pattern on which a chip component is mounted as viewed from the top.

FIG. 15 relates to the embodiment 13 of the present invention, and is a plan view of the wiring patterns 31A, 31B on which the chip component 41 is mounted as viewed from the top.

In the embodiment 13, the wiring portion 34a of the wiring pattern 31A and the wiring portion 34b of the wiring pattern 31B are disposed at the positions asymmetric with each other with respect to the center O of the chip component 41, however, the embodiment 13 exhibits a form different from that of the embodiment 12.

In the embodiment 13, the wiring portion 34a is connected to the land y-direction outermost lateral side 54 that is outermost in the y-direction of the land 33a by the connection portion 53. The connection portion 53 of the embodiment 13 is arranged on the opposite side of that of the embodiment 12 with respect to the center line Yo. The wiring portion x-direction outermost lateral side 52 that is outermost in the x-direction of the wiring portion 34a is on the straight line same to the land x-direction outermost lateral side 51 that is outermost in the x-direction of the lands 33a, 33b.

The wiring portion 34b is connected to the land x-direction outermost lateral side 51 that is outermost in the x-direction of the land 33b by the connection portion 53. Also, the wiring portion 34b includes a straight line portion and an inclined portion, the straight line portion is extended in the y-direction from the land 33b, and the inclined portion is arranged to continue to the end of the straight line portion and is connected to the pattern portion 32b. As described above, the shape of the drawing out portion extended out from the connection portion 56 toward the pattern portion 32b does not affect the action of the crack generated in the connection portion of the solder 42.

The other configurations in the embodiment 13 are similar to those of the embodiment 1. Therefore, in the embodiment 13 also, the effect similar to that of the embodiments 1-12 is exerted.

Embodiment 14

Figure 16:
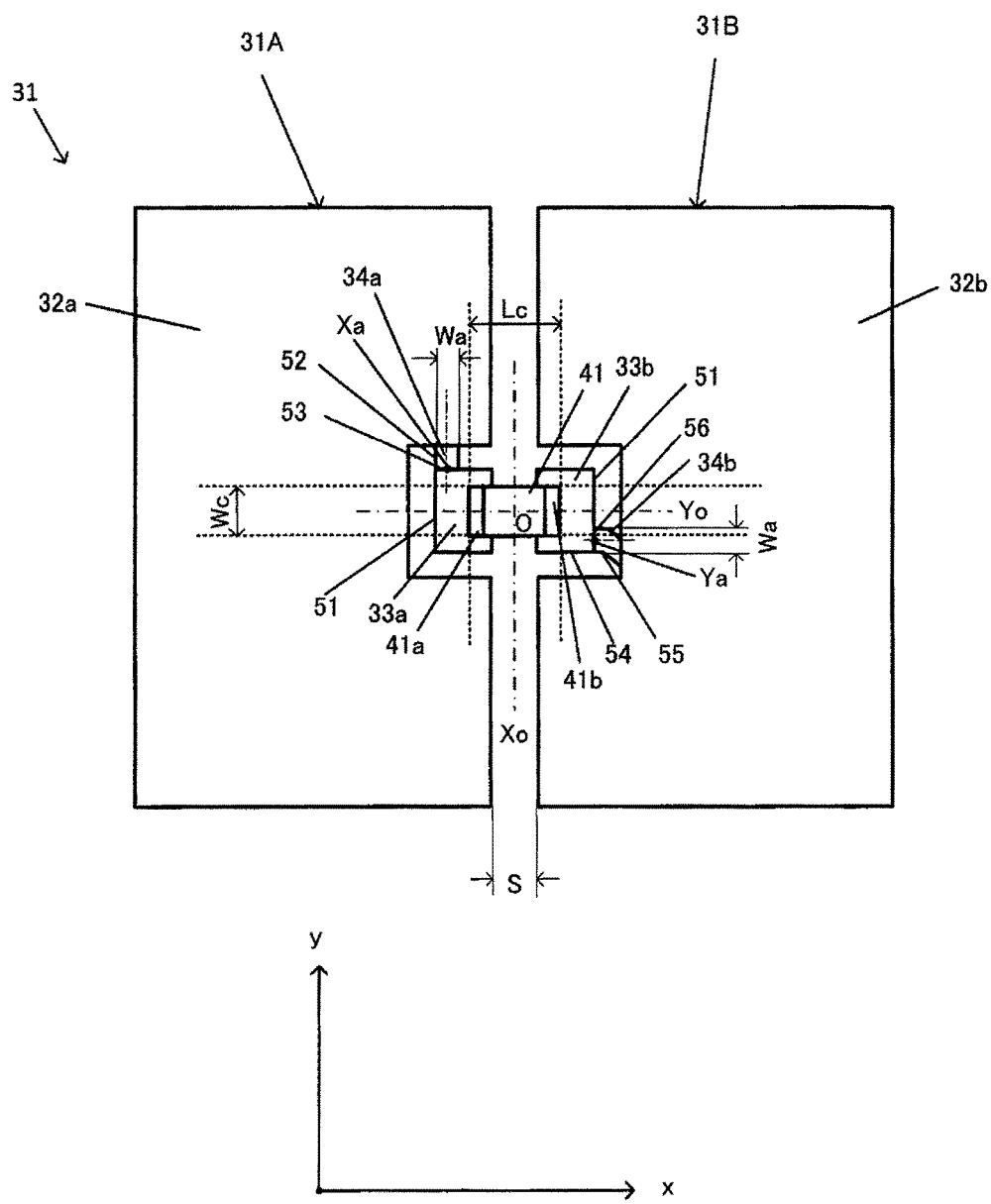
FIG. 16 relates to the embodiment 14 of the present invention, and is a plan view of a wiring pattern on which a chip component is mounted as viewed from the top.

FIG. 16 relates to the embodiment 14 of the present invention, and is a plan view of the wiring patterns 31A, 31B on which the chip component 41 is mounted as viewed from the top.

In the embodiment 14 also, the wiring portion 34a of the wiring pattern 31A and the wiring portion 34b of the wiring pattern 31B are disposed at the positions asymmetric with each other with respect to the center O of the chip component 41, however, the embodiment 14 exhibits a form different from that of the embodiments 12, 13.

The embodiment 14 is same to the embodiment 13 in the point that the wiring portion 34b of the wiring pattern 31B includes an inclined portion, but is different from the embodiment 13 only in the point that the inclination direction of the inclined portion is opposite.

However, all of the other configurations are same to those of the embodiment 13.

Therefore, in the embodiment 14 also, the effect similar to that of the embodiments 1-13 is exerted.

(Evaluation Test of Wire Breakage)

The wire breakage caused by the crack in the solder connection portion of the electrodes 41a, 41b and the lands 33a, 33b of the chip component 41 was evaluated by the test.

In the test, the embodiment 2, the embodiment 8, the comparative example 1 and the comparative example 2 were compared.

Figure 17:
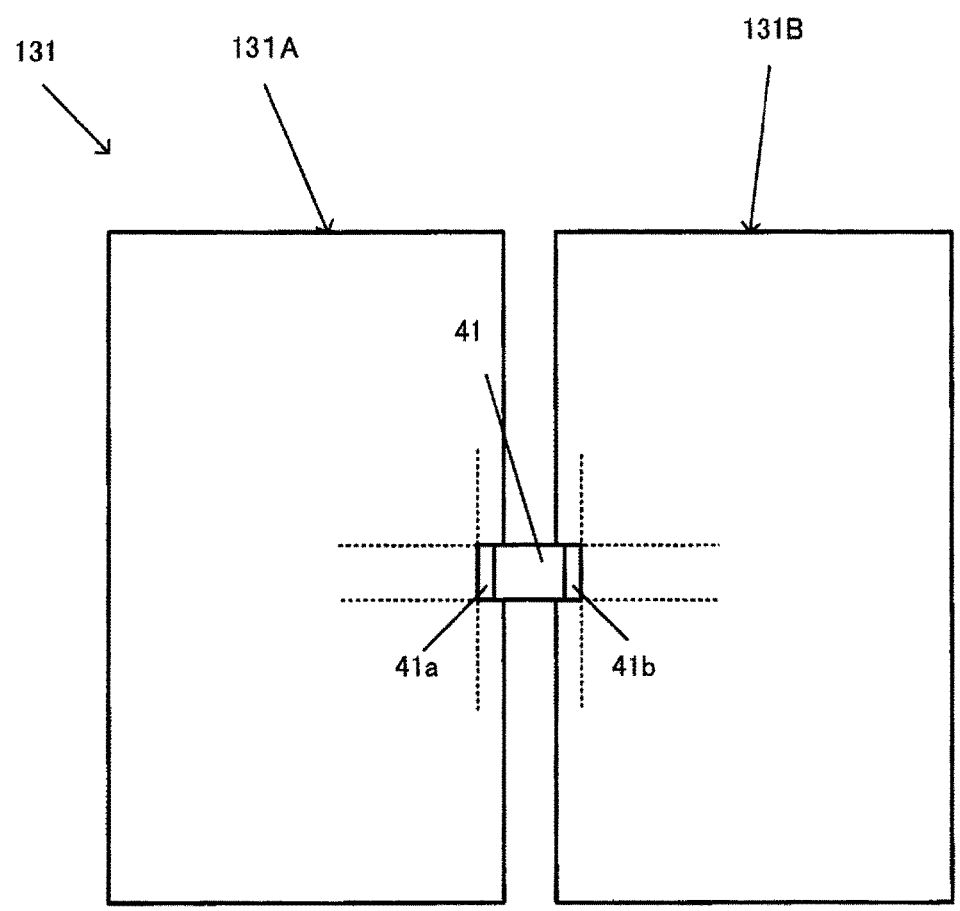
FIG. 17 is a plan view of a wiring pattern on which a chip component is mounted as viewed from the top shown as the comparative example 1.

FIG. 17 is a plan view of the comparative example 1 of wiring patterns 131A, 131B on which the chip component 41 is mounted as viewed from the top.

The wiring patterns 131A, 131B are solid patterns, and do not include a land and a wiring portion. The electrodes 41a, 41b of the chip component 41 were soldered directly to the wiring patterns 131A, 131B.

Figure 18:
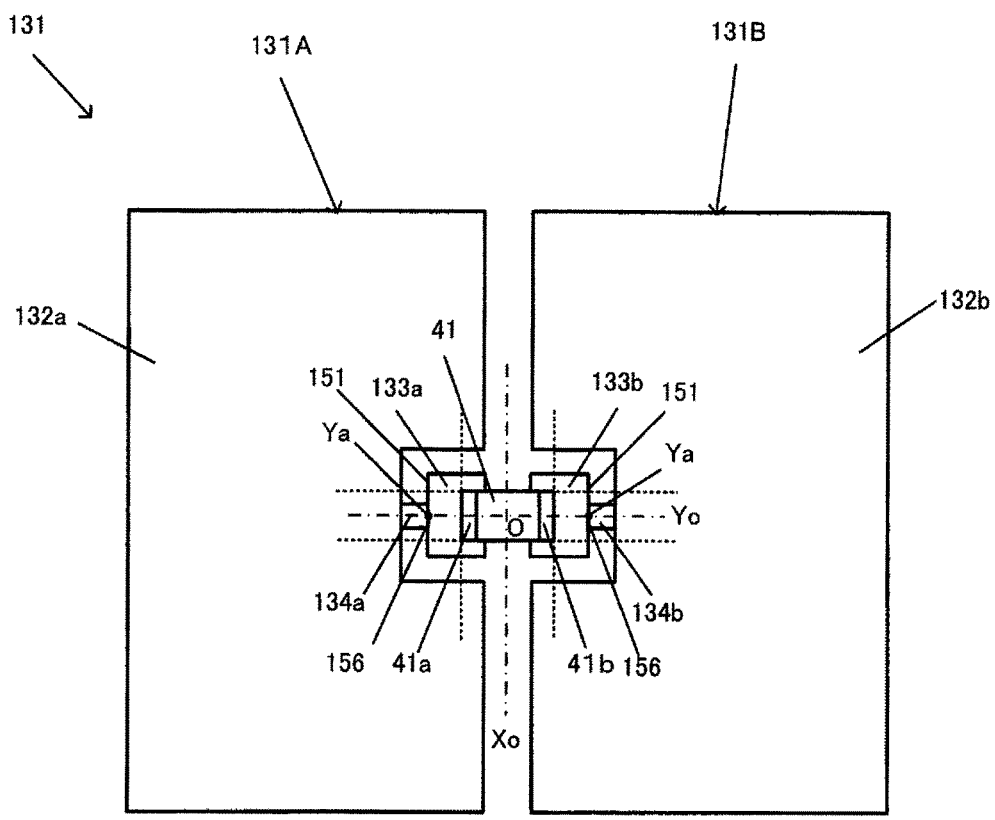
FIG. 18 is a plan view of a wiring pattern on which a chip component is mounted as viewed from the top shown as the comparative example 2.

FIG. 18 is a plan view of the comparative example 2 of the wiring patterns 131A, 131B on which the chip component 41 is mounted as viewed from the top.

The wiring patterns 131A, 131B include pattern portions 132a, 132b, lands 133a, 133b, and wiring portions 134a, 134b.

The wiring portions 134a, 134b are extended out in parallel with the center line Yo, and are connected to land x-direction outermost lateral sides 151 which are outermost in the x-direction of the lands 133a, 133b by connection portions 156. The connection portions 156 are disposed within a region in which a region of the width Wc of the chip component 41 extends in the x-direction. Therefore, naturally, the center Ya in the y-direction of the connection portion 156 is disposed within a range in which a region of the width Wc of the chip component 41 extends in the x-direction.

The test condition is as follows.

For the circuit wiring board 30, one with the base board 38 of an aluminum material with 50 mm square and 2 mm thickness was used. The insulation layer 37 was arranged on the base board 38, and the wiring patterns 31A, 31B or 131A, 131B were formed on the insulation layer 37 by a copper foil.

For the chip component 41, a chip resistor of 1608 (1.6 mm×0.8 mm) size was used. The electrodes 41a, 42b of the chip component 41 were soldered to the wiring patterns 31A, 31B or 131A, 131B using a lead-free solder of Sn3Ag0.5Cu.

After soldering, the temperature cycle test of −30/80° C. was executed. The resistance value of each sample was measured at every 500 cycles, and the case with 10% or more of the resistance value variation was determined to be the wire breakage. The sample number of each sample was made N=5.

The result of the above test is shown in FIG. 19.

In the comparative example 1, the wire breakage occurred in 3 samples at 1,500 cycles, and in all 5 samples at 2,000 cycles or more. In the comparative example 2, the wire breakage occurred in 2 samples at 1,500 cycles, and in all 5 samples at 2,000 cycles or more. On the other hand, in the embodiment 2 and the embodiment 8 of the present invention, it was confirmed that the wire breakage did not occur even after executing 3,000 cycles. By this test, the effect by the present invention was endorsed.

Also, the wiring patterns 31A, 31B shown in the embodiments 1-15 described above are examples of the preferred aspect, and the shape, size and the like of the pattern portions 32a, 32b, the lands 33a, 33b, and the wiring portions 34a, 34b can be modified appropriately. For example, the lands 33a, 33b are not limited to the rectangular shape, and may be of other polygons and the shape having a curved line portion such as an arc section or a hypotenuse portion in the outline. Also, the pattern portion 32a and the pattern portion 32b may be of an asymmetric shape with each other, and may be of different shapes. The wiring route of the wiring portions 34a, 34b is free, and an arc portion and a curved line portion may be included.

Each embodiment described above was explained by a case of connecting the electrodes 41a, 41b and the lands 33a, 33b of the chip component 41 to each other using the solder 42. However, the material for connection is not limited to the solder 42, but can be applied to the laser welding, resistance welding, and the like in which one of the land or the electrode is molten for joining.

The chip component 41 is not limited to the rectangular shape in a plan view, and may have a profile including an arc portion and a curved line portion.

As described above, in short, the electronic control device of the present invention only has to be one in which the center in the width direction in the connection portion of the wiring portion connected to the land is disposed outside of both a region in which a region of the width of the electronic component extends in the longitudinal direction of the electronic component and a region in which a region of the length of the electronic component extends in the transverse direction of the electronic component.

REFERENCE SIGNS LIST

1 Case base portion
2 Case cover portion
3 Case
10 Electronic control device
30 Circuit wiring board
31, 31A, 31B Wiring pattern
32a, 32b Pattern portion
33a, 33b Land
34a, 34b Wiring portion
41 Chip component (electronic component)
41a, 41b Electrode
51, 52, 54, 55 Lateral side
53, 56 Connection portion
Lc Length (of chip component)
Wc Width (of chip component)
Wa Width (of wiring portion)
Xo Center line in X-direction (of chip component)
Yo Center line in y-direction (of chip component)
Xa Center in X-direction (of connection portion)
Ya Center in Y-direction (of connection portion)

The invention claimed is:

1. An electronic control device comprising:
a circuit wiring board in which a wiring pattern is formed on a base metal, with the wiring pattern including
a pair of patterns having a large area,
a pair of lands arranged between the pair of patterns at a predetermined interval and having an area smaller than that of the pair of patterns, and
a pair of wiring portions connecting the pair of lands and the pair of patterns respectively, wherein one of the pair of wiring portions connects a respective land of the pair of lands with a respective pattern of the pair of patters; and
an electronic component having a transverse direction and a longitudinal direction which is arranged normal to the traverse direction, wherein
the electronic component has electrodes having a predetermined length and a predetermined width, the electrodes being arranged in one end and the other end in the longitudinal direction respectively,
a respective electrode of the electronic component is connected to a respective land of the pair of lands,
the wiring portions of the pair of wiring portions are arranged so that each of a respective center in the width direction of a connection portion connecting a respective wiring portion of the pair of wiring portions to a respective land of the pair of lands is disposed at a position that is outside of both
a region formed when the predetermined width of the electronic component extends in the longitudinal direction of the electronic component,
a region formed when the predetermined length of the electronic component extends in the transverse direction of the electronic component,
at least one wiring portion of the pair of wiring portions is extended in the transverse direction of the electronic component,
a lateral side of the land of the pair of lands to which the least one of the wiring portions is connected on the farther side from the center line extending in the transverse direction of the electronic component, and a lateral side of the least one of the wiring portions on the farther side from the center line extending in the transverse direction of the electronic component are connected to each other at a position where the distance from the center line extending in the longitudinal direction of the electronic component is the same for the respective lateral sides.

2. The electronic control device according to claim 1, wherein the pair of the wiring portions are formed to be line-symmetric with each other with respect to the center line extending in the transverse direction of the electronic component.

3. The electronic control device according to claim 1, wherein the pair of the wiring portions are formed to be point-symmetric with each other with respect to the center of the electronic component.

4. The electronic control device according to claim 1, wherein each wiring portion of the pair of wiring portions is connected to the lateral side of a respective land of the pair of lands on the farther side from the center line extending in the transverse direction of the electronic component.

5. The electronic control device according to claim 1, wherein each land of the pair of lands has a rectangular shape in which the length parallel to the longitudinal direction of the electronic component is shorter than the length parallel to the transverse direction of the electronic component in a plan view, and wherein a respective electrode of the pair of electrodes of the electronic component is connected to a respective land of the pair of lands by solder not containing lead.

6. The electronic control device according to claim 4, wherein each wiring portion of the pair of wiring portions is extended in the longitudinal direction of the electronic component.

7. The electronic control device according to claim 6, wherein the pair of the wiring portions are formed to be line-symmetric with each other with respect to the center line extending in the longitudinal direction of the electronic component.

8. The electronic control device according to claim 6, wherein the pair of the wiring portions are formed to be point-symmetric with each other with respect to the center of the electronic component.

\* \* \* \* \*